(12) United States Patent
Lua et al.

(10) Patent No.: US 8,773,897 B2
(45) Date of Patent: Jul. 8, 2014

(54) WRITING CIRCUIT FOR A MAGNETORESISTIVE MEMORY CELL, MEMORY CELL ARRANGEMENT AND METHOD OF WRITING INTO A MAGNETORESISTIVE MEMORY CELL OF A MEMORY CELL ARRANGEMENT

(71) Applicants: Yan Hwee Sunny Lua, Singapore (SG); Kejie Huang, Singapore (SG)

(72) Inventors: Yan Hwee Sunny Lua, Singapore (SG); Kejie Huang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 20 days.

(21) Appl. No.: 13/708,868

(22) Filed: Dec. 7, 2012

(65) Prior Publication Data
US 2013/0343116 A1  Dec. 26, 2013

Related U.S. Application Data

(60) Provisional application No. 61/568,195, filed on Dec. 8, 2011.

(51) Int. Cl.
*G11C 11/00* (2006.01)

(52) U.S. Cl.
USPC .......................................................... 365/158

(58) Field of Classification Search
CPC . G11C 11/1675; G11C 11/5607; G11C 11/16
USPC .......................................................... 365/158
See application file for complete search history.

(56) References Cited

U.S. PATENT DOCUMENTS

| 8,018,011 B2 * | 9/2011 | Ranjan et al. ................. 257/421 |
| 2002/0135018 A1 * | 9/2002 | Hidaka ........................... 257/359 |
| 2007/0164336 A1 * | 7/2007 | Saito et al. ..................... 257/295 |

* cited by examiner

*Primary Examiner* — Anthan Tran
(74) *Attorney, Agent, or Firm* — Blakely, Sokoloff, Taylor & Zafman LLP

(57) ABSTRACT

A writing circuit for a magnetoresistive memory cell is provided. The writing circuit includes a first electrical connecting terminal, a second electrical connecting terminal, a third electrical connecting terminal, a fourth electrical connecting terminal, a first reference potential terminal, a second reference potential terminal, a first switch configured to couple one of the first electrical connecting terminal, the second electrical connecting terminal, the third electrical connecting terminal and the fourth electrical connecting terminal to the magnetoresistive memory cell, and a second switch configured to couple the first reference potential terminal to the magnetoresistive memory cell if the first electrical connecting terminal or the second electrical connecting terminal is coupled to the magnetoresistive memory cell, and to couple the second reference potential terminal to the magnetoresistive memory cell if the third electrical connecting terminal or the fourth electrical connecting terminal is coupled to the magnetoresistive memory cell.

20 Claims, 21 Drawing Sheets

WRITING CIRCUIT FOR A MAGNETORESISTIVE MEMORY CELL, MEMORY CELL ARRANGEMENT AND METHOD OF WRITING INTO A MAGNETORESISTIVE MEMORY CELL OF A MEMORY CELL ARRANGEMENT

CROSS-REFERENCE TO RELATED APPLICATION

This application claims the benefit of priority of U.S. Provisional Patent Application No. 61/568,195 filed 8 Dec. 2011, the contents of which being hereby incorporated by reference in its entirety for all purposes.

TECHNICAL FIELD

Various embodiments relate generally to a writing circuit for a magnetoresistive memory cell, a memory cell arrangement and a method of writing into a magnetoresistive memory cell of a memory cell arrangement.

BACKGROUND

Non-volatile memories (NVM) are gaining more attention due to the capability of retaining of information even when power is turned off. Spin transfer torque magnetoresistive random access memory (STT-MRAM) is considered as a promising candidate for the next generation of non-volatile memory. STT-MRAM has the advantages of scalability, high endurance, high speed and low energy consumption.

In order for MRAM to be industrially viable, it is desirable to increase the memory storage density of MRAM devices. One way of increasing memory storage density in STT-MRAM devices is to have a multi-bit per cell (MBPC) design. Circuits for writing and sensing the single bit STT-MRAM devices might not be suitable for STT-MRAM with MBPC design.

Therefore, it is desirable to provide write and sense circuitries of STT-MRAM with MBPC design.

SUMMARY

According to one embodiment, a writing circuit for a magnetoresistive memory cell is provided. The writing circuit includes a first electrical connecting terminal configured to provide a first electrical signal in a first direction to the magnetoresistive memory cell, a second electrical connecting terminal configured to provide a second electrical signal in the first direction to the magnetoresistive memory cell, a third electrical connecting terminal configured to provide a third electrical signal in a second direction to the magnetoresistive memory cell, a fourth electrical connecting terminal configured to provide a fourth electrical signal in the second direction to the magnetoresistive memory cell, a first reference potential terminal, a second reference potential terminal, a first switch configured to couple one of the first electrical connecting terminal, the second electrical connecting terminal, the third electrical connecting terminal and the fourth electrical connecting terminal to the magnetoresistive memory cell, and a second switch configured to couple the first reference potential terminal to the magnetoresistive memory cell if the first electrical connecting terminal or the second electrical connecting terminal is coupled to the magnetoresistive memory cell, and to couple the second reference potential terminal to the magnetoresistive memory cell if the third electrical connecting terminal or the fourth electrical connecting terminal is coupled to the magnetoresistive memory cell. The first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell. The first electrical signal, the second electrical signal, the third electrical signal and the fourth electrical signal have different amplitudes. The first electrical signal, the second electrical signal, the third electrical signal and the fourth electrical signal have the same polarity.

According to another embodiment, a memory cell arrangement is provided. The memory cell arrangement includes a plurality of magnetoresistive memory cells, and a writing circuit for the magnetoresistive memory cell. The writing circuit includes a first electrical connecting terminal configured to provide a first electrical signal in a first direction to the magnetoresistive memory cell, a second electrical connecting terminal configured to provide a second electrical signal in the first direction to the magnetoresistive memory cell, a third electrical connecting terminal configured to provide a third electrical signal in a second direction to the magnetoresistive memory cell, a fourth electrical connecting terminal configured to provide a fourth electrical signal in the second direction to the magnetoresistive memory cell, a first reference potential terminal, a second reference potential terminal, a first switch configured to couple one of the first electrical connecting terminal, the second electrical connecting terminal, the third electrical connecting terminal and the fourth electrical connecting terminal to the magnetoresistive memory cell, and a second switch configured to couple the first reference potential terminal to the magnetoresistive memory cell if the first electrical connecting terminal or the second electrical connecting terminal is coupled to the magnetoresistive memory cell, and to couple the second reference potential terminal to the magnetoresistive memory cell if the third electrical connecting terminal or the fourth electrical connecting terminal is coupled to the magnetoresistive memory cell. The first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell. The first electrical signal, the second electrical signal, the third electrical signal and the fourth electrical signal have different amplitudes. The first electrical signal, the second electrical signal, the third electrical signal and the fourth electrical signal have the same polarity.

According to yet another embodiment, a method of writing into a magnetoresistive memory cell of a memory cell arrangement is provided. The method includes coupling one of a first electrical connecting terminal, a second electrical connecting terminal, a third electrical connecting terminal and a fourth electrical connecting terminal to the magnetoresistive memory cell, coupling a first reference potential terminal to the magnetoresistive memory cell if the first electrical connecting terminal or the second electrical connecting terminal is coupled to the magnetoresistive memory cell, and coupling a second reference potential terminal to the magnetoresistive memory cell if the third electrical connecting terminal or the fourth electrical connecting terminal is coupled to the magnetoresistive memory cell. The first electrical connecting terminal provides a first electrical signal in a first direction to the magnetoresistive memory cell, the second electrical connecting terminal provides a second electrical signal in the first direction to the magnetoresistive memory cell, the third electrical connecting terminal provides a third electrical signal in a second direction to the magnetoresistive memory cell, and the fourth electrical connecting terminal provides a fourth electrical signal in the second direction to the magnetoresistive memory cell. The first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell. The first electrical signal, the second electrical signal, the third electrical signal and the fourth electrical signal have different amplitudes. The first electrical signal, the second electrical signal, the third electrical signal and the fourth electrical signal have the same polarity.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Embodiments of a writing circuit for a magnetoresistive memory cell, a memory cell arrangement and a method of writing into a magnetoresistive memory cell of a memory cell arrangement will be described in detail below with reference to the accompanying figures. It will be appreciated that the embodiments described below can be modified in various aspects without changing the essence of the invention.

Various embodiments may include magnetic non-volatile memory. Magnetic non-volatile memory may include magnetoresistive memory and spin transfer torque magnetic random access memory (STT-MRAM). In various embodiments, the terms "memory cell" and "cell" can be used interchangeably. The terms "memory cell" and "cell" can refer to "magnetoresistive memory cell" and "spin transfer torque magnetic random access memory (STT-MRAM)".

Various embodiments may include STT-MRAM with multi-bit per cell (MBPC), and its write and sense circuitries. Various embodiments may include write and sense circuitries of STT-MRAM with MBPC design for controlled and repeatable access of the desired multi-bits data stored/written in the cells. The design of the supply of current/voltage reference, the reading/writing environment experienced by each device, and the occupancy area are some of the factors which can affect the access speed and reliability performance of the MBPC STT-MRAM.

A STT-MRAM with MBPC may include at least one ferromagnetic hard layer as a reference layer (RL), at least two ferromagnetic soft layers as free layers (FLs), and/or at least two assisting ferromagnetic structures at the side of each free layer to assist the switching of its magnetization. The spacer layers (SLs) between the RL and FLs can be either a non-magnetic conductor or a tunneling insulator. The change in the resistance of STT-MRAM with MBPC is based on either giant-magnetoresistance (GMR) or tunneling magneto-resistance (TMR) effect, depending whether the spacer layer is a non-magnetic conductor or a tunneling barrier, respectively. When the magnetizations of the FL and RL are in parallel (P) directions, the magnetoresistance will be in the low resistance state. The magnetoresistance will be in the high resistance state when both the FL and RL are in an anti-parallel (AP) configuration. The switching of the magnetization direction of the FL can occur by spin transfer torque effect, having an electrical current flowing through the magnetic tunnel junction (MTJ). The direction of the magnetization switching can be controlled by the direction of the electrical current flow. The difference in the magnetic state configuration may be determined by the read out voltages from the cell.

Figure 1:
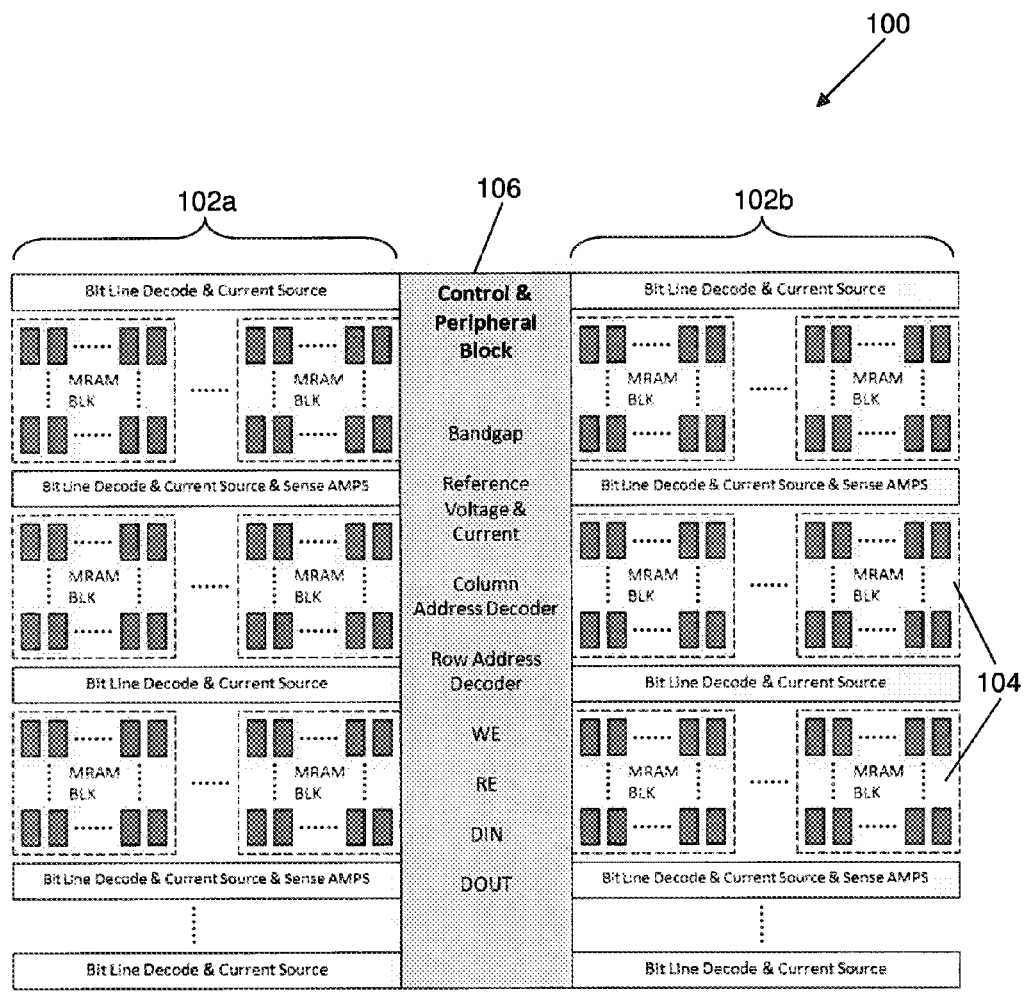
FIG. 1 shows a simplified schematic layout of a memory according to one embodiment.

FIG. 1 shows a simplified schematic layout of a memory 100. The memory 100 is portioned into two main memory bank blocks 102a, 102b. Each memory bank block 102a, 102b is then broken down in many sub-memory blocks 104. Each sub-memory block 104 is addressed by equal and same number of row addresses. A control and peripheral block 106 is arranged between the two main memory bank blocks 102a, 102b. The control and peripheral block 106 may include logic control unit, band-gap and reference generator, bias block, buffers and other peripheral circuitry blocks. This arrangement can allow for shorter and more equally distributed routing. This can also reduce potential drop along the lines and delays in the signal propagation. The control and peripheral block 106 may manage the data in and out, write enable, read enable, information on the row and column address decoders, reference current and other controlling signal for the switches.

Figure 2:
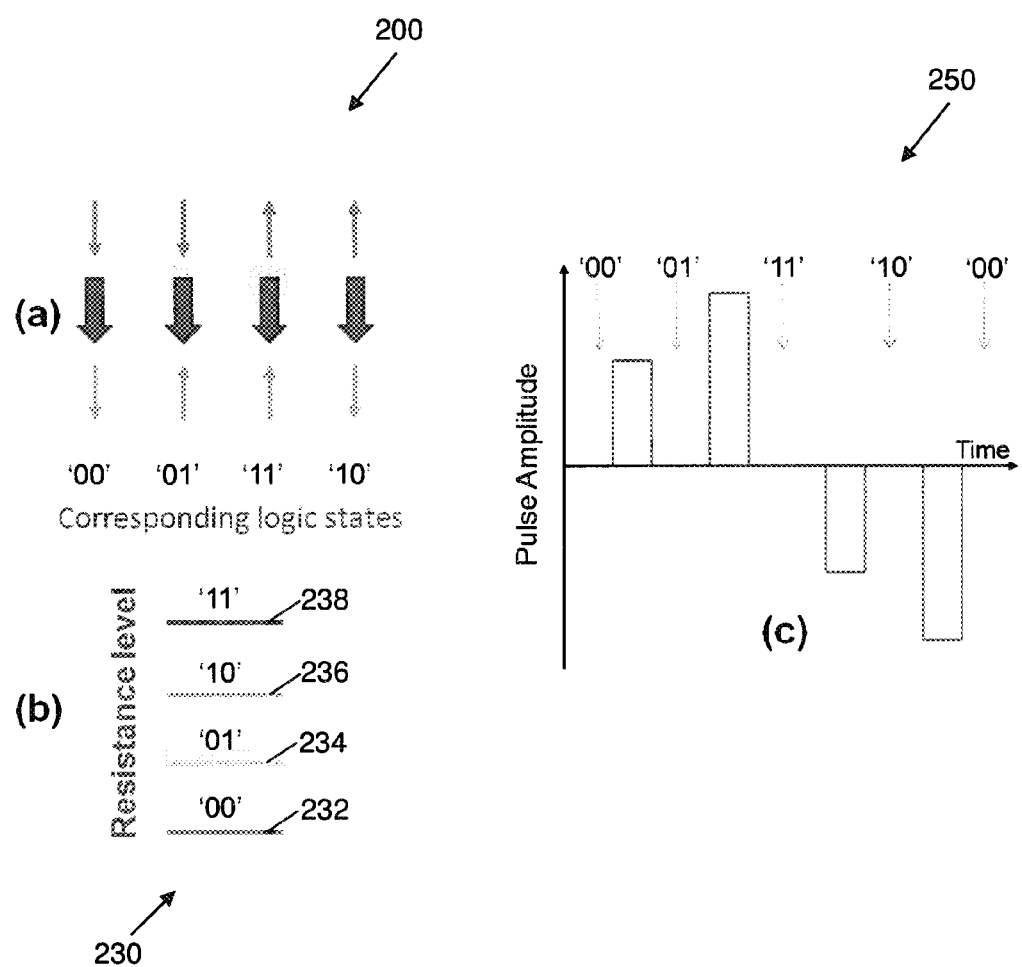
FIG. 2a shows magnetic configurations and corresponding logic states of a memory cell according to one embodiment.
FIG. 2b shows resistance levels for different magnetic configurations and corresponding logic states of a memory cell according to one embodiment.
FIG. 2c shows current pulse amplitudes for writing/reading different magnetic configurations and corresponding logic states according to one embodiment.

In various embodiments, for STT-MRAM, the magnetic configuration of the cell can be manipulated by the direction of the flowing current if the current density and pulse width are above the critical values for the spin transfer torque switching of the free layer. The current flow needs to be bi-directional for the desired reversal of the free-layer(s). For a 2-bits per cell (2BPC) MTJ, there will be four magnetic configurations. FIG. 2a shows a diagram 200 illustrating the magnetization directions of the two free layers with respect to the fixed/reference layer for the four magnetic configurations which correspond to the bits "00", "01", "10" and "11". There are differences in resistance values for the four magnetic configurations. By associating each resistance value with a corresponding quantum level, the binary states can be formed accordingly with two bits. FIG. 2b shows a diagram 230 illustrating the resistance levels for different binary states. The lowest resistance level 232 corresponds to binary bits "00", the next higher resistance level 234 corresponds to binary bits "01", the next higher resistance level 236 corresponds to binary bits "10" and the highest resistance level 238 corresponds to binary bits "11". In one embodiment, the resistance level can be associated with the binary level in a reverse order. The lowest resistance level may correspond to binary bits "11", the next higher resistance level corresponds to binary bits "10", the next higher resistance level corresponds to binary bits "01" and the highest resistance level corresponds to binary bits "00". In one embodiment, the resistance level can be associated with the binary level in an order defined by a user. By spin transfer torque effect, the magnetization of respective free layers of the cell can be determined by a combination of current pulse amplitude and direction. The configuration of the magnetization states of the 2BPC device can determine the resistance value and indirectly the logic state. FIG. 2c shows a graph 250 illustrating respective current pulse amplitudes for writing/reading the logic states "00", "01", "10" and "11".

Figure 3:
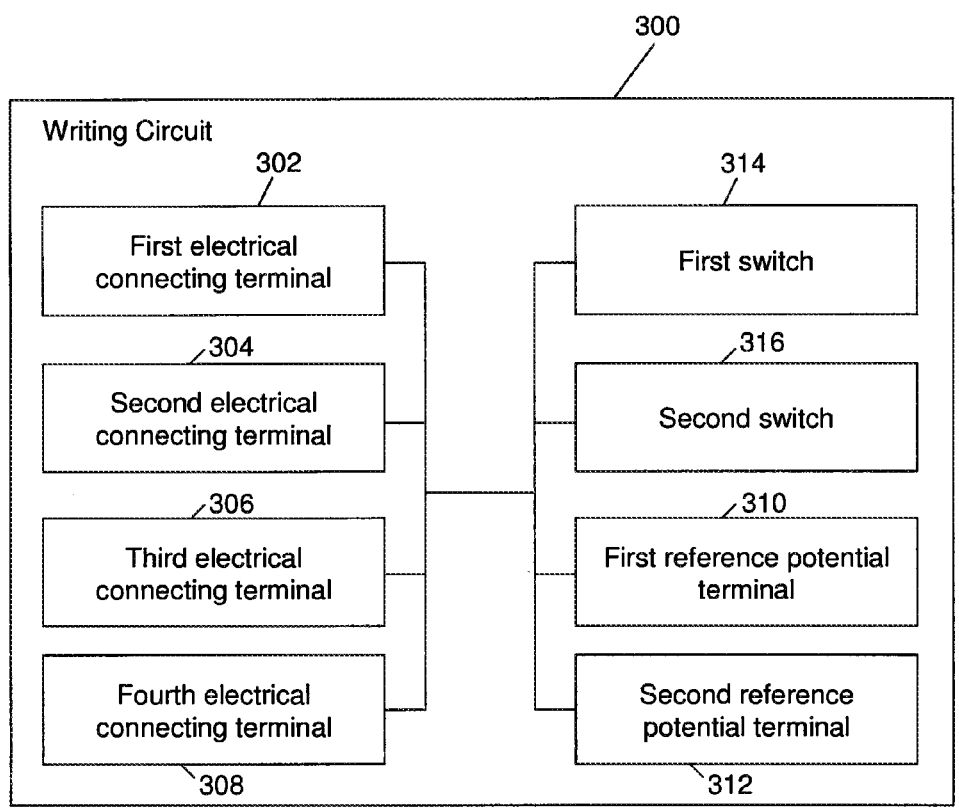
FIG. 3 shows a schematic diagram of a writing circuit for a magnetoresistive memory cell according to one embodiment.

FIG. 3 shows a schematic diagram of a writing circuit 300 for a magnetoresistive memory cell. The writing circuit 300 may include a first electrical connecting terminal 302 configured to provide a first electrical signal in a first direction to the magnetoresistive memory cell, a second electrical connecting terminal 304 configured to provide a second electrical signal in the first direction to the magnetoresistive memory cell, a third electrical connecting terminal 306 configured to provide a third electrical signal in a second direction to the magnetoresistive memory cell, and a fourth electrical connecting terminal 308 configured to provide a fourth electrical signal in the second direction to the magnetoresistive memory cell. The first direction may correspond to a direction from a first terminal of the magnetoresistive memory cell to a second terminal of the magnetoresistive memory cell. The second direction may correspond to a direction from the second terminal of the magnetoresistive memory cell to the first terminal of the magnetoresistive memory cell.

The writing circuit 300 may include a first reference potential terminal 310 and a second reference potential terminal 312. The writing circuit 300 may also include a first switch 314 configured to couple one of the first electrical connecting terminal 302, the second electrical connecting terminal 304, the third electrical connecting terminal 306 and the fourth electrical connecting terminal 308 to the magnetoresistive memory cell. The writing circuit 300 may also include a second switch 316 configured to couple the first reference potential terminal 310 to the magnetoresistive memory cell if the first electrical connecting terminal 302 or the second electrical connecting terminal 304 is coupled to the magnetoresistive memory cell, and to couple the second reference potential terminal 312 to the magnetoresistive memory cell if the third electrical connecting terminal 306 or the fourth electrical connecting terminal 308 is coupled to the magnetoresistive memory cell.

In one embodiment, the first electrical signal, the second electrical signal, the third electrical signal and the fourth electrical signal may have different amplitudes. The first electrical signal, the second electrical signal, the third electrical signal and the fourth electrical signal may have the same polarity.

In one embodiment, the first electrical connecting terminal 302, the second electrical connecting terminal 304, the third electrical connecting terminal 306 and the fourth electrical connecting terminal 308 may be arranged in parallel and at the same side of the magnetoresistive memory cell. The first reference potential terminal 310 and the second reference potential terminal 312 may be arranged in parallel and at the other side of the magnetoresistive memory cell facing away from the first electrical connecting terminal 302, the second electrical connecting terminal 304, the third electrical connecting terminal 306 and the fourth electrical connecting terminal 308.

In one embodiment, the second reference potential terminal 312 may include ground.

In one embodiment, the first switch 314 may include a first transistor, a second transistor, a third transistor and a fourth transistor respectively comprising a source terminal, a drain terminal and a gate terminal. The drain terminal of the first transistor, the drain terminal of the second transistor, the drain terminal of the third transistor and the drain terminal of the fourth transistor may be coupled to a bit line. The source terminal of the first transistor may be coupled to the first electrical connecting terminal 302, the source terminal of the second transistor may be coupled to the second electrical connecting terminal 304, the source terminal of the third transistor may be coupled to the third electrical connecting terminal 306, and the source terminal of the fourth transistor may be coupled to the fourth electrical connecting terminal 308. Alternatively, the switches 314 and 316 may be formed using transmission gates.

In one embodiment, the second switch 316 may include a fifth transistor and a sixth transistor respectively comprising a source terminal, a drain terminal and a gate terminal. The drain terminal of the fifth transistor and the drain terminal of the sixth transistor may be coupled to a source line. The source terminal of the fifth transistor may be coupled to the first reference potential terminal 310 and the source terminal of the sixth transistor may be coupled to the second reference potential terminal 312.

In another embodiment, the first electrical connecting terminal 302, the second electrical connecting terminal 304 and the second reference potential terminal 310 may be arranged in parallel and at the same side of the magnetoresistive memory cell. The third electrical connecting terminal 306, the fourth electrical connecting terminal 308 and the first reference potential terminal 312 may be arranged in parallel and at the other side of the magnetoresistive memory cell facing away from the first electrical connecting terminal 302, the second electrical connecting terminal 304 and the second reference potential terminal 306.

In one embodiment, each of the first reference potential terminal 310 and the second reference potential terminal 312 may include ground.

In one embodiment, the first switch 314 may include a first transistor, a second transistor, a third transistor and a fourth transistor respectively comprising a source terminal, a drain terminal and a gate terminal. The drain terminal of the first transistor and the drain terminal of the second transistor may be coupled to a source line. The drain terminal of the third transistor and the drain terminal of the fourth transistor may be coupled to a bit line. The source terminal of the first transistor may be coupled to the first electrical connecting terminal 302, the source terminal of the second transistor may be coupled to the second electrical connecting terminal 304, the source terminal of the third transistor may be coupled to the third electrical connecting terminal 306, and the source terminal of the fourth transistor may be coupled to the fourth electrical connecting terminal 308.

In one embodiment, the second switch 316 may include a fifth transistor and a sixth transistor respectively comprising a source terminal, a drain terminal and a gate terminal. The drain terminal of the fifth transistor may be coupled to the bit line and the drain terminal of the sixth transistor may be coupled to the source line. The source terminal of the fifth transistor may be coupled to the first reference potential terminal 310 and the source terminal of the sixth transistor may be coupled to the second reference potential terminal 312.

In one embodiment, the plurality of electrical connecting terminals 302, 304, 306, 308 may include at least one of voltage sources or current sources. The electrical signals may include at least one of voltage signals or current signals.

In one embodiment, the writing circuit may include a plurality of electrical connecting terminals. The number of electrical connecting terminals may be dependent on the number of bits to be written into the magnetoresistive memory cell. The number of electrical connecting terminals may be $2^n$ or ($2^n+1$), where n is the number of bits to be written into the magnetoresistive memory cell.

In one embodiment, the writing circuit 300 may further include a current overdriving protection circuit coupled to one or more of the plurality of electrical connecting terminals.

Figure 4:
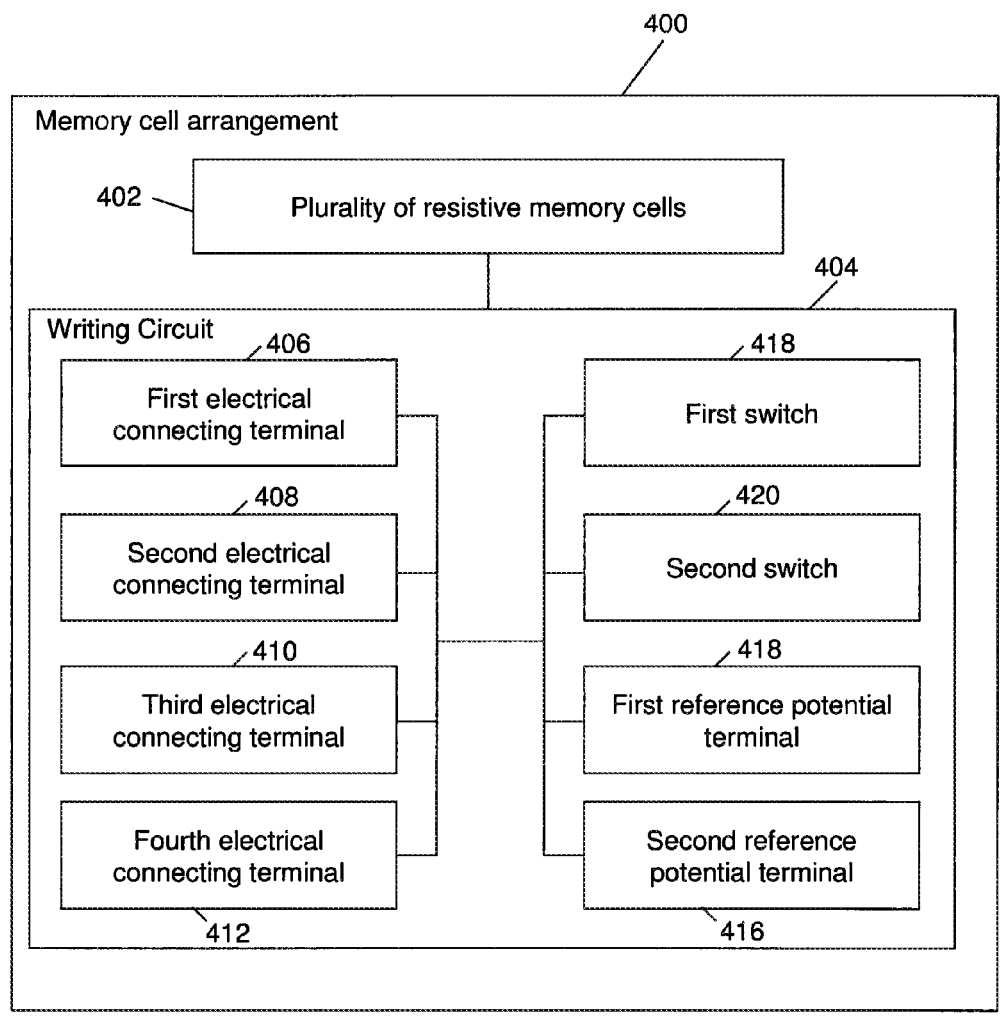
FIG. 4 shows a schematic diagram of a memory cell arrangement according to one embodiment.

FIG. 4 shows a schematic diagram of a memory cell arrangement 400. The memory cell arrangement 400 may include a plurality of magnetoresistive memory cells 402 and a writing circuit 404 for the magnetoresistive memory cell. The writing circuit 404 may include a first electrical connecting terminal 406 configured to provide a first electrical signal in a first direction to the magnetoresistive memory cell, a second electrical connecting terminal 408 configured to provide a second electrical signal in the first direction to the magnetoresistive memory cell, a third electrical connecting terminal 410 configured to provide a third electrical signal in a second direction to the magnetoresistive memory cell, and a fourth electrical connecting terminal 412 configured to provide a fourth electrical signal in the second direction to the magnetoresistive memory cell. The first direction may correspond to a direction from a first terminal of the magnetoresistive memory cell to a second terminal of the magnetoresistive memory cell. The second direction may correspond to a direction from the second terminal of the magnetoresistive memory cell to the first terminal of the magnetoresistive memory cell.

The writing circuit 404 may include a first reference potential terminal 414 and a second reference potential terminal 416. The writing circuit 404 may also include a first switch 418 configured to couple one of the first electrical connecting terminal 406, the second electrical connecting terminal 408, the third electrical connecting terminal 410 and the fourth electrical connecting terminal 412 to the magnetoresistive memory cell. The writing circuit 404 may also include second switch 420 configured to couple the first reference potential terminal 414 to the magnetoresistive memory cell if the first electrical connecting terminal 406 or the second electrical connecting terminal 408 is coupled to the magnetoresistive memory cell, and to couple the second reference potential terminal 416 to the magnetoresistive memory cell if the third electrical connecting terminal 410 or the fourth electrical connecting terminal 412 is coupled to the magnetoresistive memory cell.

In one embodiment, the first electrical signal, the second electrical signal, the third electrical signal and the fourth electrical signal may have different amplitudes. The first electrical signal, the second electrical signal, the third electrical signal and the fourth electrical signal may have the same polarity.

In one embodiment, the magnetoresistive memory cell may be a spin transfer torque magnetoresistive random access memory.

In one embodiment, the writing circuit 404 may have the same or similar arrangements/configurations as the writing circuit 300 of FIG. 300.

Figure 5:
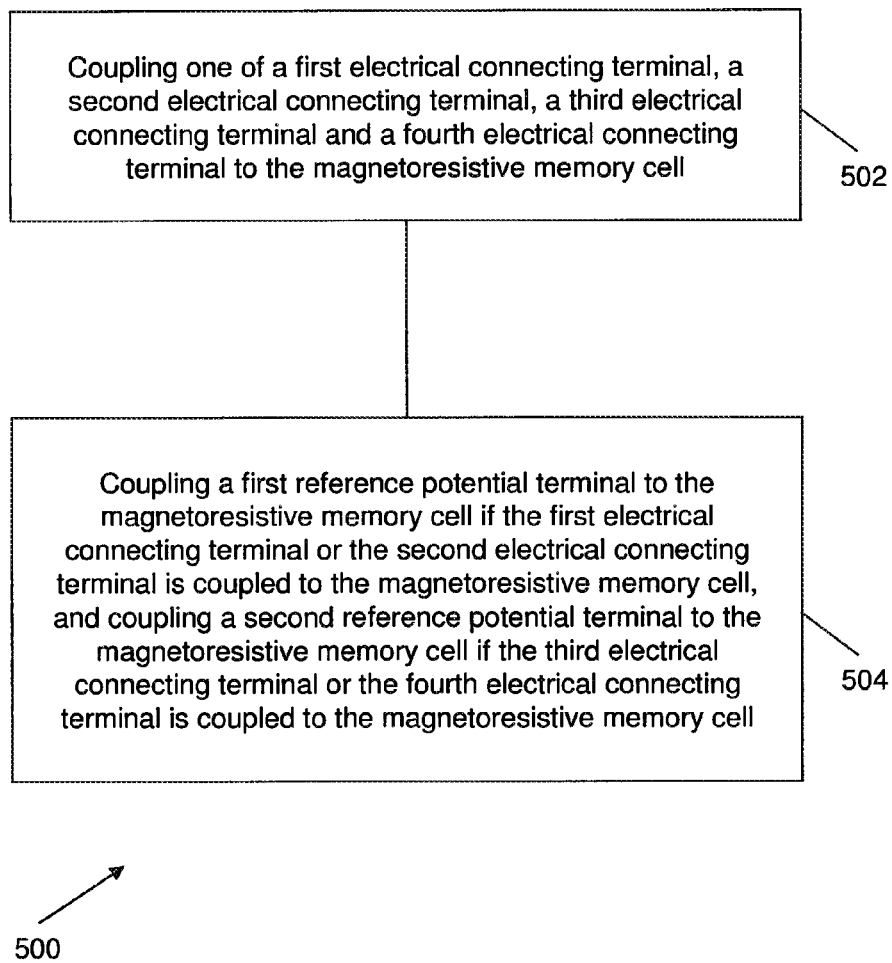
FIG. 5 shows a flowchart of a method of writing into a magnetoresistive memory cell of a memory cell arrangement according to one embodiment.

FIG. 5 shows a flowchart 500 of a method of writing into a magnetoresistive memory cell of a memory cell arrangement. At 502, one of a first electrical connecting terminal, a second electrical connecting terminal, a third electrical connecting terminal and a fourth electrical connecting terminal may be coupled to the magnetoresistive memory cell. At 504, a first reference potential terminal may be coupled to the magnetoresistive memory cell if the first electrical connecting terminal or the second electrical connecting terminal is coupled to the magnetoresistive memory cell, and a second reference potential terminal may be coupled to the magnetoresistive memory cell if the third electrical connecting terminal or the fourth electrical connecting terminal is coupled to the magnetoresistive memory cell.

In one embodiment, the first electrical connecting terminal provides a first electrical signal in a first direction to the magnetoresistive memory cell, the second electrical connecting terminal provides a second electrical signal in the first direction to the magnetoresistive memory cell, the third electrical connecting terminal provides a third electrical signal in a second direction to the magnetoresistive memory cell, and the fourth electrical connecting terminal provides a fourth electrical signal in the second direction to the magnetoresistive memory cell.

In one embodiment, the first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell.

In one embodiment, the first electrical signal, the second electrical signal, the third electrical signal and the fourth electrical signal have different amplitudes. The first electrical signal, the second electrical signal, the third electrical signal and the fourth electrical signal have the same polarity.

In one embodiment, two possible modes of writing can be implemented on the MBPC STT-MRAM. They are current pulse mode and voltage pulse mode, respectively. Current pulse writing is described in the following. It will be understood by a skilled person that the same scheme can also be implemented using voltage pulses from voltage sources.

The current sources for writing n-bits per cell will require $2^n$ or ($2^n+1$) amplitudes and/or directions. Therefore, for writing n-bits per cell, $2^n$ or ($2^n+1$) current sources are needed. For 2 bits per cell (2BPC) device with current pulse writing, four writing current sources are needed. The four current sources will deliver current pulse with specific directional flow to achieve respective logic states in the cell.

Figure 6:
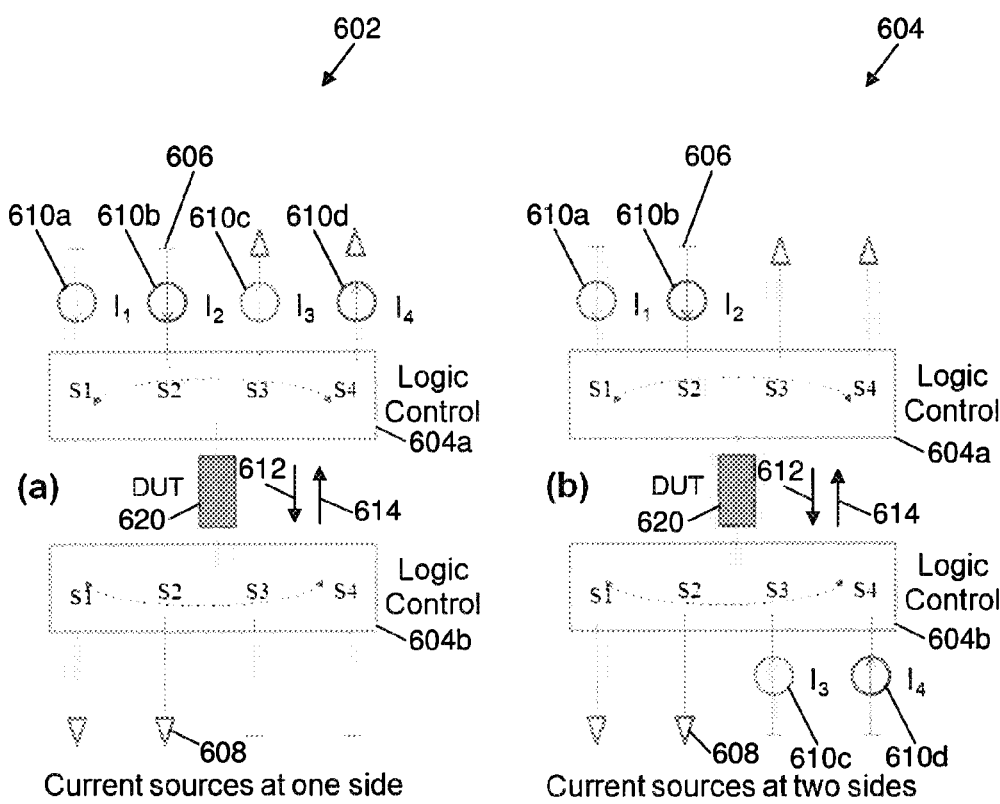
FIG. 6a shows an arrangement of current sources for a bidirectional writing scheme according to one embodiment.
FIG. 6b shows an arrangement of current sources for a bidirectional writing scheme according to one embodiment.

FIG. 6a shows an exemplary arrangement 602 of the four current sources 610a, 610b, 610c, 610d for a bidirectional writing scheme for MBPC STT-MRAM. All the four current sources 610a, 610b, 610c, 610d and 6b are arranged at one side of the memory cell 620. FIG. 6b shows another exemplary arrangement 604 of the four current sources 610a, 610b, 610c, 610d for the bidirectional writing scheme for MBPC STT-MRAM. The four current sources 610a, 610b, 610c, 610d are arranged at both sides of the memory cell 620.

In both exemplary arrangements 602, 604, the orientation of the current sources 610a, 610b, 610c, 610d and the respective terminals are configured for bidirectional current flow. A set of logic control 604a, 604b is used for the multiplexing the respective switches S1, S2, S3, S4 for the determination of both the current amplitude and its direction to be delivered to the memory cell 620. Each current source 610a, 610b, 610c, 610d may be pre-determined with a desired current amplitude so that the current is able to switch the desired free layer of the memory cell 620 but not overdrive the memory cell 620.

For example, to have current pulse $I_2$ delivered to the memory cell 620, both switches S2 from both the logic control 604a, 604b can be selected for both exemplary arrangements 602, 604. This will close the circuit for the high terminal 606, the current source 610b, the memory cell 620 and the ground terminal 608. Current $I_2$ flows through the memory cell 620 in a top-down direction 612. To have the current to flow oppositely (e.g. in an opposite direction 614), the switches S3 or S4 from both the logic control 604a, 604b can be selected for both exemplary arrangements 602, 604, depending on the current amplitude ($I_3$ or $I_4$) required.

Figure 7A:
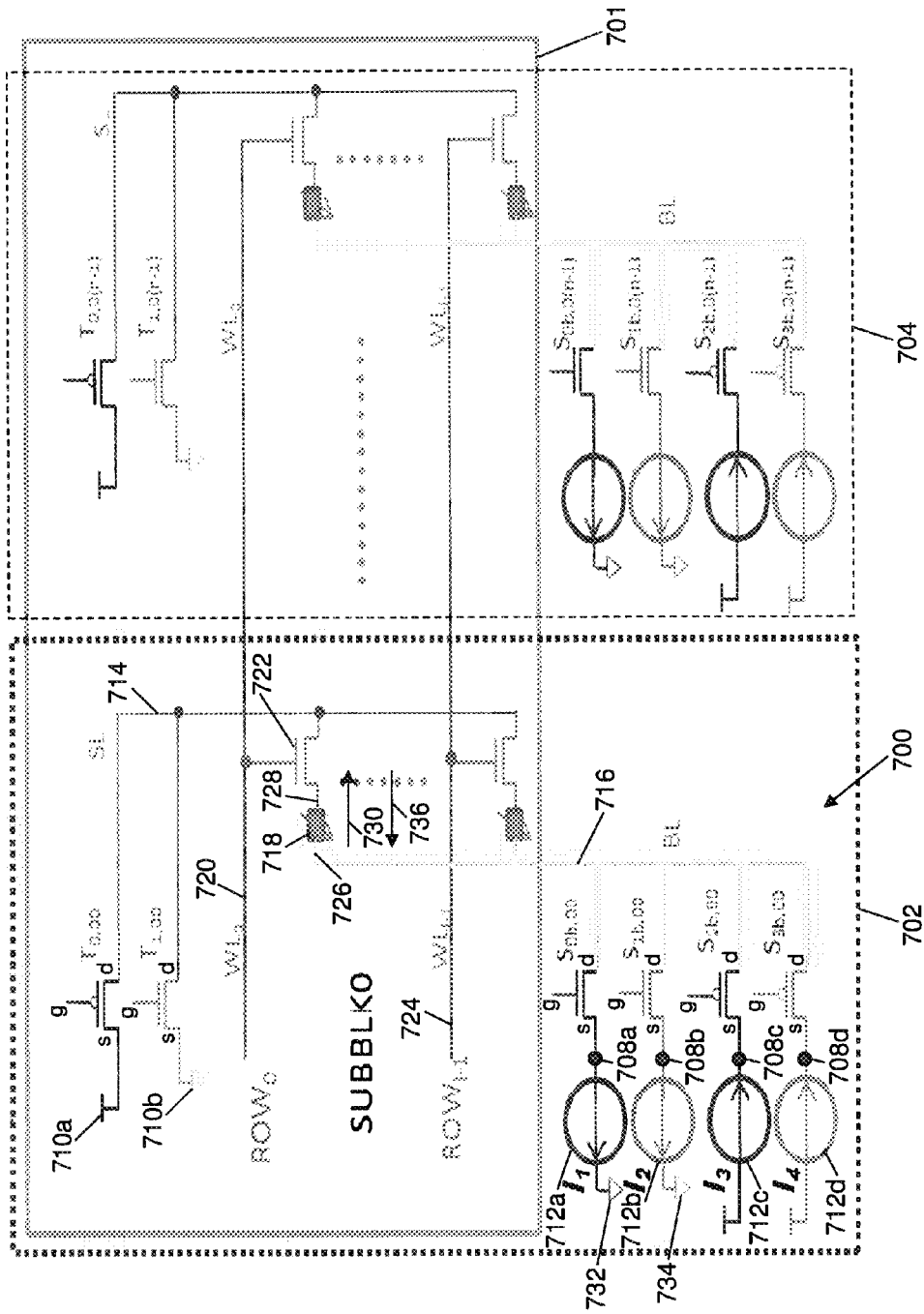
FIG. 7a shows a schematic circuit diagram of a writing circuit according to one embodiment.

FIG. 7a shows a schematic circuit diagram of a writing circuit 700 according to one embodiment. The writing circuit 700 can be used for a unit block (e.g. block 0 701) of a memory cell arrangement for each column (e.g. column 0 702, column (n−1) 704, where n is the total number of columns in the memory cell arrangement). The writing circuit 700 may be used for writing a plurality of bits into a memory cell. For simplicity of illustration, the writing circuit 700 for writing 2 bits per cell is shown.

The writing circuit 700 has a first electrical connecting terminal 708a, a second electrical connecting terminal 708b, a third electrical connecting terminal 708c and a fourth electrical connecting terminal 708d. The four electrical connecting terminals 708a-708d are grouped together at one end of the memory unit block 701.

The writing circuit 700 has a first reference potential terminal 710a and a second reference potential terminal 710b. In one embodiment, the second reference potential terminal 710b may be ground.

The first reference potential terminal 710a and a second reference potential terminal 710b are grouped on the other end of the memory unit block 701. This configuration is simple and is an easy design for small capacity memory.

In one embodiment, the four electrical connecting terminals 708a-708d may include current sources. The first electrical connecting terminal 708a may include a first current source 712a which can provide a current $I_1$, the second electrical connecting terminal 708b may include a second current source 712b which can provide a current $I_2$, the third electrical connecting terminal 708c may include a third current source 712c which can provide a current $I_3$, and the fourth electrical connecting terminal 708d may include a fourth current source 712d which can provide a current $I_4$.

In one embodiment, the first electrical connecting terminal 708a may be coupled to the first current source 712a, the second electrical connecting terminal 708b may be coupled to the second current source 712b, the third electrical connecting terminal 708c may be coupled to the third current source 712c, and the fourth electrical connecting terminal 708d may be coupled to the fourth current source 712d. The first current source 712a, the second current source 712b, the third current source 712c and the fourth current source 712d may be current sources external to the memory cell arrangement and the writing circuit 700.

Each current source 712a-712d can be preprogrammed with different amplitudes so that the current density which will be delivered is sufficient to change the corresponding free layer (FL). As the routing to each MTJ device (e.g. memory cell) is symmetrical, the devices will experience the same writing environment. If the loading on the bit line 716 is heavy, the memory block (e.g. block 0 710) can be reduced into smaller sub-block by having less number of rows per memory sub-blocks. Increasing the number of current sources can reduce loading and improve the write speed. Although a unit block 710 of memory is shown with the current sources and terminals, the current source circuitry and terminals can be shared between two or more adjacent memory sub-blocks. This can aid in the reduction in silicon area. In addition, the bias and addresses are reused in the design. This reduces the area used.

The first current source 712a, the second current source 712b, the third current source 712c and the fourth current source 712d can be multiplexed selectively by a respective switch $S_{0b,00}$, $S_{1b,00}$, $S_{2b,00}$, $S_{3b,00}$ in the form of a transistor or transmission gate, through a logic control block (not shown). In one embodiment, the switches $S_{0b,00}$, $S_{1b,00}$, $S_{2b,00}$, and $S_{3b,00}$ may collectively referred as the first switch 314 of the writing circuit 300 of FIG. 3.

The switches $S_{0b,00}$, $S_{1b,00}$, $S_{2b,00}$, and $S_{3b,00}$ may respectively include a source terminal (s), a drain terminal (d) and a gate terminal (g). The drain terminal (d) of the switch $S_{0b,00}$, the drain terminal (d) of the switch $S_{1b,00}$, the drain terminal (d) of the switch $S_{2b,00}$ and the drain terminal (d) of the switch $S_{3b,00}$ may be coupled to a bit line 716. The source terminal (s) of the switch $S_{0b,00}$ may be coupled to the first electrical connecting terminal 708a, the source terminal (s) of the switch $S_{1b,00}$ may be coupled to the second electrical connecting terminal 708b, the source terminal (s) of the switch $S_{2b,00}$ may be coupled to the third electrical connecting terminal 708c, and the source terminal (s) of the switch $S_{3b,00}$ may be coupled to the fourth electrical connecting terminal 708d. Alternatively, transmission gates may be included as the switches.

The first reference potential terminal 710a and the second reference potential terminal 710b can be multiplexed selectively by a respective terminal transistor $T_{0,00}$, $T_{1,00}$, through a logic control block (not shown). The transistors $T_{0,00}$ and $T_{1,00}$ may collectively referred as the second switch 316 of the writing circuit 300 of FIG. 3.

The transistors $T_{0,00}$ and $T_{1,00}$ may respectively include a source terminal (s), a drain terminal (d) and a gate terminal (g). The drain terminal (d) of the transistor $T_{0,00}$ and the drain terminal (d) of the transistor $T_{1,00}$ may be coupled to a source line 714. The source terminal (s) of the transistor $T_{0,00}$ may be coupled to the first reference potential terminal 710a and the source terminal (s) of the transistor $T_{1,00}$ may be coupled to the second reference potential terminal 710b.

To write information to cell (0, 0) 718 in block 0 701, column 0 702, a write enable (WE) command will be initiated. To generate, say a current pulse of $I_3$, the switch $S_{2b,00}$ and the transistor $T_{1,00}$ will be turned on by the logic control unit, while the other switches and transistors are turned off. Concurrently, the word line ($WL_0$) 720 is put to high to turn on the corresponding select transistor 722 for cell (0, 0) 718, while the rest of the word lines (e.g. $WL_{l-1}$ 724, where l is the total number of rows of the unit block 0 701) are turned off. Current pulse $I_3$ flows from the bottom circuitry, from a second terminal 726 of the MTJ cell (0, 0) 720 to a first terminal 728 of the MTJ cell (0, 0) 720, through the select transistor 722 and then terminates at the ground terminal (e.g. second reference potential terminal 710b) located at the top. After the completion of this writing phase, WE will be de-activated. The duration of the injected pulse may be determined by the duration of the "on" state of the WE signal.

Figure 7B:
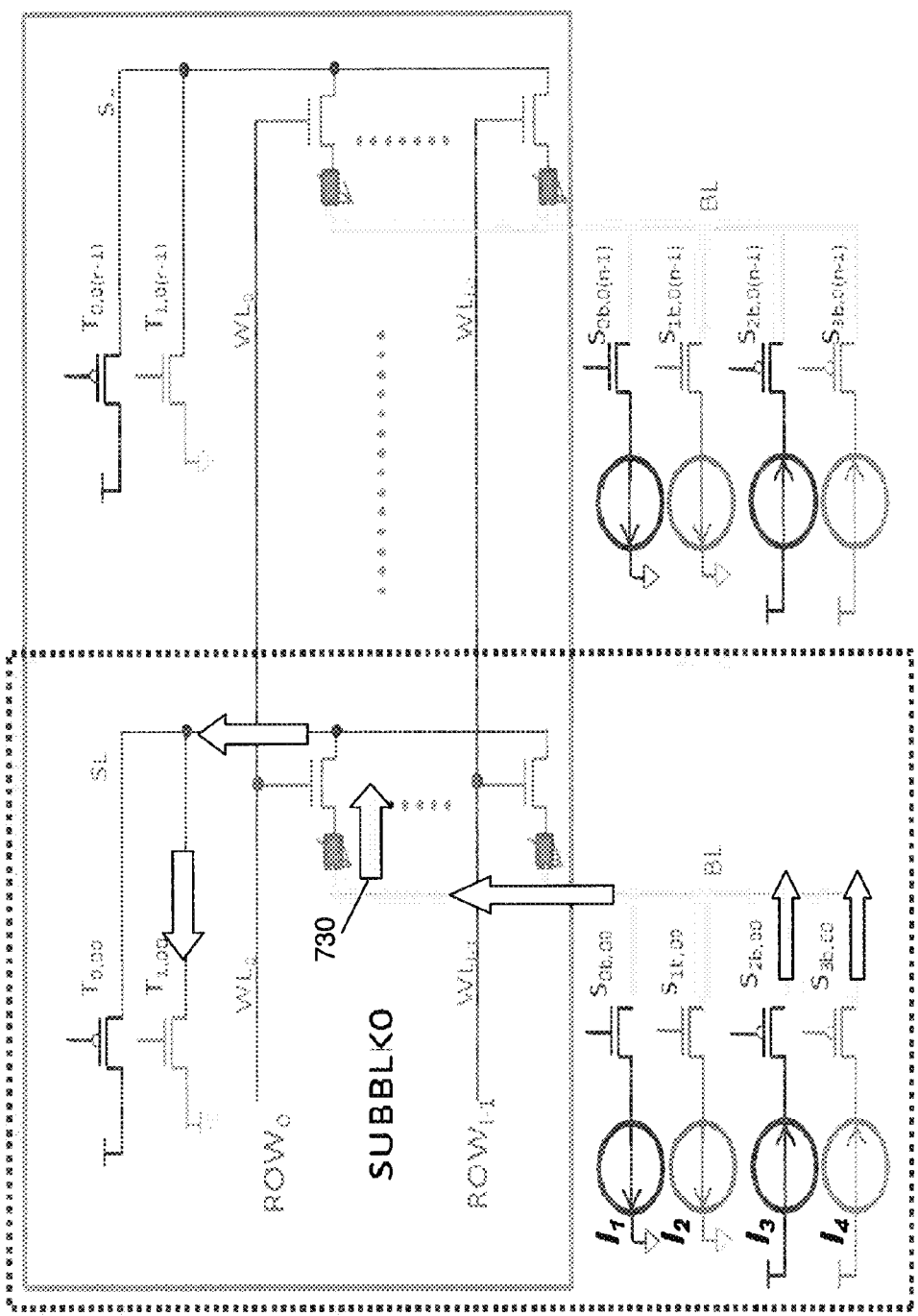
FIG. 7b shows a direction of a flow of a current pulse provided to a memory cell according to one embodiment.

The current pulse $I_3$ flows in a direction 730 which corresponds to a direction from the second terminal 726 of the cell (0, 0) 718 to the first terminal 728 of the cell (0, 0) 718. The current pulse $I_4$ may also flow in the direction 730. The direction 730 of the flow of current pulse $I_3$ or the current pulse $I_4$ are shown in FIG. 7b.

Figure 7C:
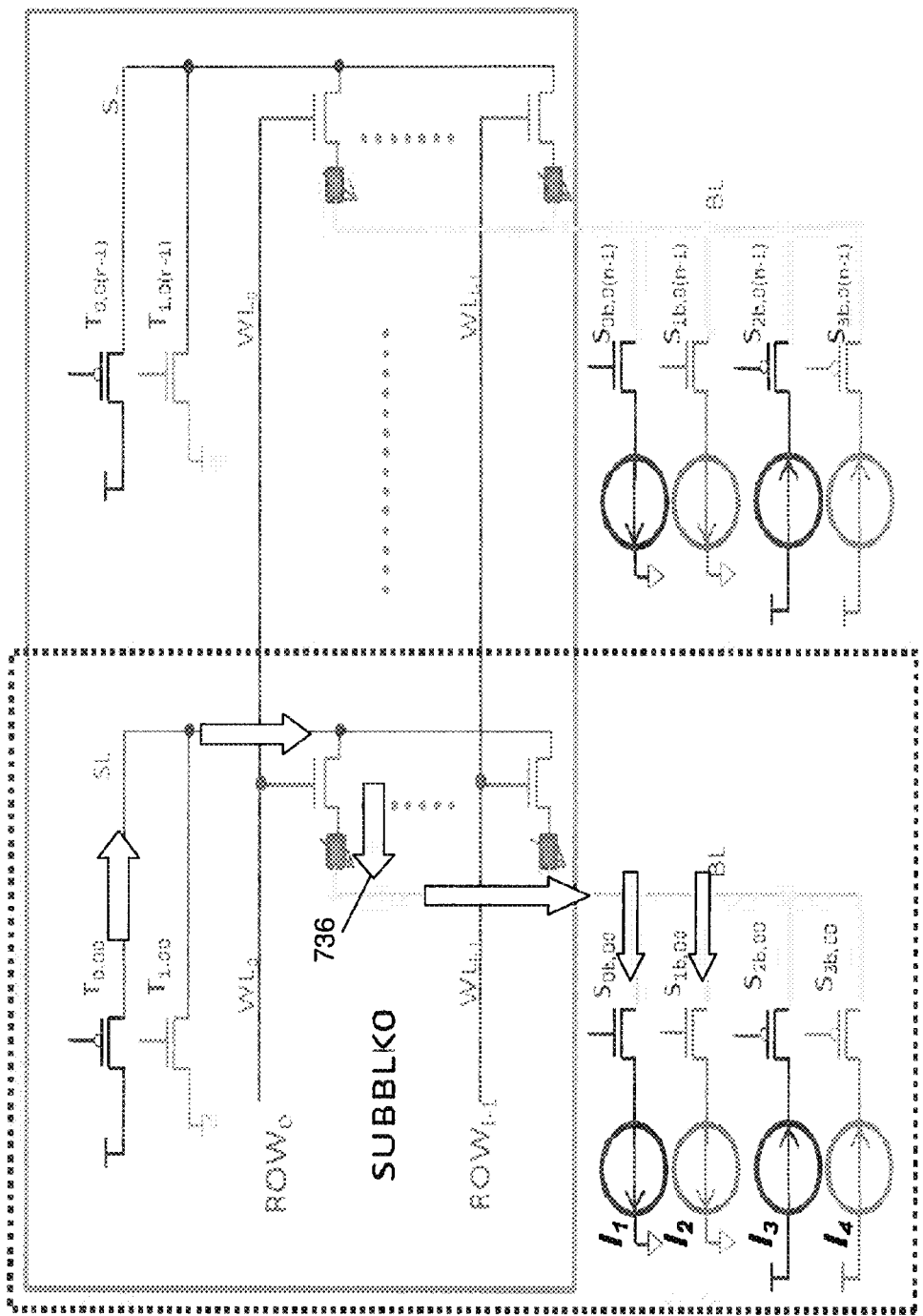
FIG. 7c shows a direction of a flow of a current pulse provided to a memory cell according to one embodiment.

In one embodiment, the current pulse $I_1$ or the current pulse $I_2$ may flow from the first reference potential terminal 710a, through the select transistor 722, from the first terminal 728 of the MTJ cell (0, 0) 718 to the second terminal 726 of the cell (0, 0) 718, and then terminates at the ground terminal 732 (for current pulse $I_1$) or ground terminal 734 (for current pulse $I_2$). The current pulse $I_1$ or the current pulse $I_2$ may flow in a direction 736 which corresponds to a direction from the first terminal 728 of the cell (0, 0) 718 to the second terminal 726 of the cell (0, 0) 718. The direction 736 of the flow of current pulse $I_3$ or the current pulse $I_4$ are shown in FIG. 7c.

The arrangement of the MTJ cells with the routing are symmetrically designed for the same potential drop across each cell. This ensures that each cell experience the same writing speed and environment.

Figure 8:
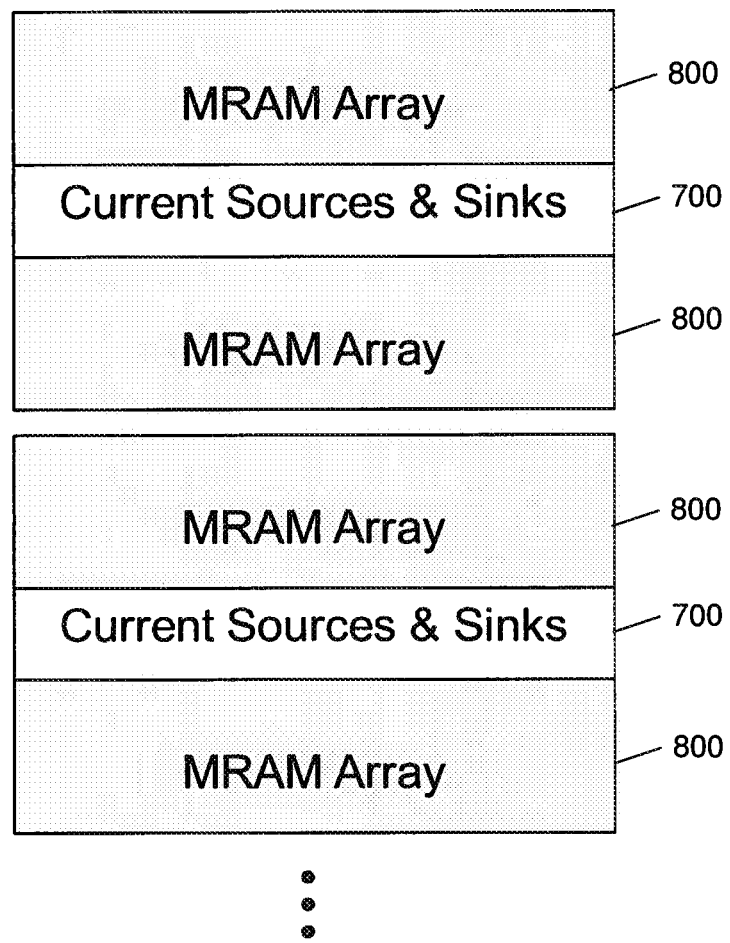
FIG. 8 shows a block diagram of an arrangement of a writing circuit and memory cell arrays according to one embodiment.

To extend the usage of the writing circuit 700, the bidirectional writing circuit 700 with current sources arranged at one side may be arranged between two memory sub-blocks 800 as shown in FIG. 8. This design could help to reduce the use of the silicon area.

The pseudo-code for the logic control of bi-directional writing circuitry for 2BPC STT-MRAM at one side is listed below:

Current sources
$S_{0b,ij}=!D_1\&!D_0\&WE\&A_{ij}$
$S_{1b,ij}=!D_1\&D_0\&WE\&A_{ij}$
$S_{2b,ij}=!(D1\&!D0\&WE\&A_{ij})$
$S_{3b,ij}=!(D1\&D0\&WE\&A_{ij})$
$A_{ij}=COL_j\&(BLK_{2i}|BLK_{2i+1})$
Terminal points
For i=0

$T_{0,0j}=!(!D_1\&WE\&COL_j\&BLK_0)$
$T_{1,0j}=D_1\&WE\&COL_j\&BLK_0$
For 0<2i<m
$T_{0,ij}=!(!D_1\&WE\&COL_j\&(BLK_{2i-1}|BLK_{2i}))$
$T_{1,ij}=D_1\&WE\&COL_j\&(BLK_{2i-1}|BLK_{2i})$
2i=m
$T_{0,0j}=!(!D_1\&WE\&COL_j\&BLK_m)$
$T_{1,0j}=D_1\&WE\&COL_j\&BLK_m$

TABLE 1

List of annotations for the signals used in the pseudo-code.

| Signal | Description |
| --- | --- |
| WE | Write Enable Signal |
| $COL_j$ | Column Selecting Address |
| $BLK_i$ | Block Selecting Signal |
| $A_{ij}$ | Arithmetic signal |
| $D_1, D_0$ | Data Bit to be written to the cell |
| $ROW_l$ | ROW Selecting Signal |
| $S_{nb,ij}$ | Signals of Bidirectional Writing Current Sources |
| $T_{n,ij}$ | Signal to Switches of Terminals |

Based on the pseudo-code for the writing scheme for the writing circuit of FIG. 7, to provide current $I_1$ to a memory cell of block i, column j, the signal of bidirectional writing current source $S_{0b,ij}$ is determined by a combination of an inverse of $D_1$ and an inverse of $D_0$ and WE and $A_{ij}$. That is, $S_{0b,ij}$ is enabled (i.e. having a logic "1") only when the data bit $D_1$ to be written into the cell is logic "0", the data bit $D_0$ to be written into the cell is logic "0", and the Write Enable signal (WE) and the Arithmetic Signal ($A_{ij}$) are enabled (i.e. having a logic "1"). For all other combinations, $S_{0b,ij}$ is disabled (i.e. having a logic "0").

The Arithmetic Signal ($A_{ij}$) is determined by a combination of $COL_j$ and either $BLK_{2i}$ or $BLK_{2i+1}$. That is, $A_{ij}$ is enabled (i.e. having a logic "1") only when the Column Selecting Address ($COL_j$) is enabled (i.e. having a logic "1") and either the Block Selecting Signal ($BLK_{2i}$) or the Block Selecting Signal ($BLK_{2i+1}$) is enabled (i.e. having a logic "1").

To provide current $I_2$ to a memory cell of block i, column j, the signal of bidirectional writing current source $S_{1b,ij}$ is determined by a combination of an inverse of $D_1$ and $D_0$ and WE and $A_{ij}$. That is, $S_{1b,ij}$ is enabled (i.e. having a logic "1") only when the data bit $D_1$ to be written into the cell is logic "0", the data bit $D_0$ to be written into the cell is logic "1", and the Write Enable signal (WE) and the Arithmetic Signal ($A_{ij}$) are enabled (i.e. having a logic "1"). For all other combinations, $S_{1b,ij}$ is disabled (i.e. having a logic "0").

To provide current $I_3$ to a memory cell of block i, column j, the signal of bidirectional writing current source $S_{2b,ij}$ is determined by the inverse of a combination of $D_1$ and an inverse of $D_0$ and WE and $A_{ij}$. That is, $S_{2b,ij}$ is enabled (i.e. having a logic "1") only when the data bit $D_1$ to be written into the cell is logic "0" or the data bit $D_0$ to be written into the cell is logic "1" or at least one of the Write Enable signal (WE) and the Arithmetic Signal ($A_{ij}$) is disabled (i.e. having a logic "0"). For all other combinations, $S_{2b,ij}$ is disabled (i.e. having a logic "0").

To provide current $I_4$ to a memory cell of block i, column j, the signal of bidirectional writing current source $S_{3b,ij}$ is determined by the inverse of a combination of $D_1$ and $D_0$ and WE and $A_{ij}$. That is, $S_{3b,ij}$ is enabled (i.e. having a logic "1") only when the data bit $D_1$ to be written into the cell is logic "0"

or the data bit $D_0$ to be written into the cell is logic "0" or at least one of the Write Enable signal (WE) and the Arithmetic Signal ($A_{ij}$) is disabled (i.e. having a logic "0"). For all other combinations, $S_{3b,ij}$ is disabled (i.e. having a logic "0").

To write data to a memory cell of block 0, column j, the signal to the switch of the first reference potential terminal ($T_{0,0j}$) is determined by the inverse of a combination of an inverse of $D_1$ and WE and $COL_j$ and $BLK_0$. That is, $T_{0,0j}$ is enabled (i.e. having a logic "1") only when the data bit $D_1$ to be written into the cell is logic "1" or at least one of the Write Enable signal (WE), the Column Selecting Address ($COL_j$) and the Block Selecting Signal ($BLK_0$) is disabled (i.e. having a logic "0"). For all other combinations, $T_{0,0j}$ is disabled (i.e. having a logic "0"). The signal to the switch of the second reference potential terminal ($T_{1,0j}$) is determined by a combination of $D_1$ and WE and $COL_j$ and $BLK_0$. That is, $T_{0,1j}$ is enabled (i.e. having a logic "1") only when the data bit $D_1$ to be written into the cell is logic "1" and the Write Enable signal (WE), the Column Selecting Address ($COL_j$) and the Block Selecting Signal ($BLK_0$) are enabled (i.e. having a logic "1"). For all other combinations, $T_{1,0j}$ is disabled (i.e. having a logic "0").

To write data to a memory cell of block 2i (0<2i<m, where m is the total number of blocks of a memory cell arrangement), column j, the signal to the switch of the first reference potential terminal ($T_{0,0j}$) is determined by the inverse of a combination of an inverse of $D_1$ and WE and $COL_j$ and either $BLK_{2i}$ or $BLK_{2i+1}$. That is, $T_{0,0j}$ is enabled (i.e. having a logic "1") only when the data bit $D_1$ to be written into the cell is logic "1" or at least one of the Write Enable signal (WE), the Column Selecting Address ($COL_j$) and either the Block Selecting Signal ($BLK_{2i}$) or the Block Selecting Signal ($BLK_{2i+1}$) is disabled (i.e. having a logic "0"). For all other combinations, $T_{0,0j}$ is disabled (i.e. having a logic "0"). The signal to the switch of the second reference potential terminal ($T_{1,0j}$) is determined by a combination of $D_1$ and WE and $COL_j$ and either $BLK_{2i}$ or $BLK_{2i+1}$. That is, $T_{0,1j}$ is enabled (i.e. having a logic "1") only when the data bit $D_1$ to be written into the cell is logic "1" and the Write Enable signal (WE), the Column Selecting Address ($COL_j$) and either the Block Selecting Signal ($BLK_{2i}$) or the Block Selecting Signal ($BLK_{2i+1}$) are enabled (i.e. having a logic "1"). For all other combinations, $T_{1,0j}$ is disabled (i.e. having a logic "0").

To write data to a memory cell of block m, column j, the signal to the switch of the first reference potential terminal ($T_{0,0j}$) is determined by the inverse of a combination of an inverse of $D_1$ and WE and $COL_j$ and $BLK_m$. That is, $T_{0,0j}$ is enabled (i.e. having a logic "1") only when the data bit $D_1$ to be written into the cell is logic "1" or at least one of the Write Enable signal (WE), the Column Selecting Address ($COL_j$) and the Block Selecting Signal ($BLK_m$) is disabled (i.e. having a logic "0"). For all other combinations, $T_{0,0j}$ is disabled (i.e. having a logic "0"). The signal to the switch of the second reference potential terminal ($T_{1,0j}$) is determined by a combination of $D_1$ and WE and $COL_j$ and $BLK_m$. That is, $T_{0,1j}$ is enabled (i.e. having a logic "1") only when the data bit $D_1$ to be written into the cell is logic "1" and the Write Enable signal (WE), the Column Selecting Address ($COL_j$) and the Block Selecting Signal ($BLK_m$) are enabled (i.e. having a logic "1"). For all other combinations, $T_{1,0j}$ is disabled (i.e. having a logic "0").

Figure 9A:
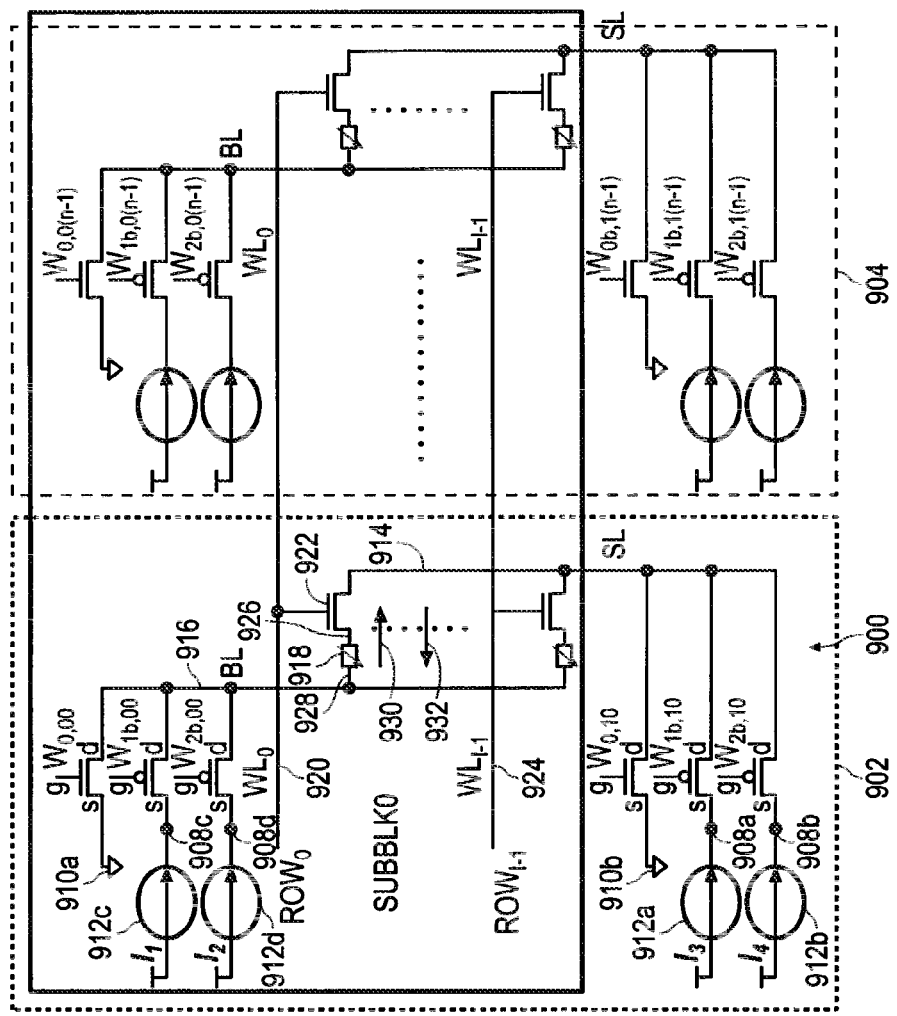
FIG. 9a shows a schematic circuit diagram of a writing circuit according to one embodiment.

FIG. 9a shows a schematic circuit diagram of a writing circuit 900 according to one embodiment. The writing circuit 900 can be used for a unit block (e.g. block 0 901) of a memory cell arrangement for each column (e.g. column 0 902, column (n−1) 904, where n is the total number of columns in the memory cell arrangement). The writing circuit 900 may be used for writing a plurality of bits into a memory cell. For simplicity of illustration, the writing circuit 900 for writing 2 bits per cell is shown. The writing circuit 900 can be used for bigger memory capacity.

The writing circuit 900 has a first electrical connecting terminal 908a, a second electrical connecting terminal 908b, a third electrical connecting terminal 908c and a fourth electrical connecting terminal 908d. The writing circuit 900 has a first reference potential terminal 910a and a second reference potential terminal 910b. In one embodiment, each of the first reference potential terminal 910a and the second reference potential terminal 910b may be ground.

In one embodiment, the writing circuit 900 has equal number of electrical connecting terminals and ground terminals located along the two sides of the memory unit block 901 with l rows of memory cells. The memory cells can experience the same writing environment.

In one embodiment, the current circuitries can be shared between two or more memory sub-blocks to reduce silicon area. In addition, the bias and addresses can be reused in the design. This can reduce the area used. Similarly, the logic control block can be used for the controlling of signals of the write switches (W).

In one embodiment, the four electrical connecting terminals 908a-708d may include current sources. The first electrical connecting terminal 908a may include a first current source 912a which can provide a current $I_3$, the second electrical connecting terminal 908b may include a second current source 912b which can provide a current $I_4$, the third electrical connecting terminal 908c may include a third current source 912c which can provide a current $I_1$, and the fourth electrical connecting terminal 908d may include a fourth current source 912d which can provide a current $I_2$.

In one embodiment, the first electrical connecting terminal 908a may be coupled to the first current source 912a, the second electrical connecting terminal 908b may be coupled to the second current source 912b, the third electrical connecting terminal 908c may be coupled to the third current source 912c, and the fourth electrical connecting terminal 908d may be coupled to the fourth current source 912d. The first current source 912a, the second current source 912b, the third current source 912c and the fourth current source 912d may be current sources external to the memory cell arrangement and the writing circuit 900.

The first current source 912a, the second current source 912b, the third current source 912c and the fourth current source 912d can be multiplexed selectively by a respective switch $W_{1b,10}$, $W_{2b,10}$, $W_{1b,00}$, $W_{2b,00}$ in the form of a transistor or transmission gate, through a logic control block (not shown). In one embodiment, the switches $W_{1b,10}$, $W_{2b,10}$, $W_{1b,00}$ and $W_{2b,00}$ may collectively referred as the first switch 314 of the writing circuit 300 of FIG. 3.

The switches $W_{1b,10}$, $W_{2b,10}$, $W_{1b,00}$ and $W_{2b,00}$ may respectively include a source terminal (s), a drain terminal (d) and a gate terminal (g). The drain terminal (d) of the switch $W_{1b,10}$ and the drain terminal (d) of the switch $W_{2b,10}$ may be coupled to a source line 914. The drain terminal (d) of the switch $W_{1b,00}$ and the drain terminal (d) of the switch $W_{2b,00}$ may be coupled to a bit line 916. The source terminal (s) of the switch $W_{1b,10}$ may be coupled to the first electrical connecting terminal 908a, the source terminal (s) of the switch $W_{2b,10}$ may be coupled to the second electrical connecting terminal 908b, the source terminal (s) of the switch $W_{1b,00}$ may be coupled to the third electrical connecting terminal 908c, and the source terminal (s) of the switch $W_{2b,00}$ may be coupled to the fourth electrical connecting terminal 908d. Alternatively, the switches may be formed using transmission gates.

The first reference potential terminal 910a and the second reference potential terminal 910b can be multiplexed selectively by a respective switch $W_{0,00}$, $W_{1,00}$ in the form of a transistor, through a logic control block (not shown). The switches $W_{0,00}$ and $W_{1,00}$ may collectively referred as the second switch 316 of the writing circuit 300 of FIG. 3.

The switches $W_{0,00}$ and $W_{1,00}$ may respectively include a source terminal (s), a drain terminal (d) and a gate terminal (g). The drain terminal (d) of the switch $W_{0,00}$ may be coupled to the bit line 916 and the drain terminal (d) of the switch $W_{1,00}$ may be coupled to the source line 914. The source terminal (s) of the switch $W_{0,00}$ may be coupled to the first reference potential terminal 910a and the source terminal (s) of the switch $W_{1,00}$ may be coupled to the second reference potential terminal 910b.

To write information to cell (0, 0) 918 in unit block 0 901, a write enable (WE) command will be initiated. To generate, say a current pulse of $I_1$, the switches $W_{1b,00}$ and $W_{0,10}$ will be turned on by the logic control, while the other switches are turned off. Concurrently, word line ($WL_0$) 920 is put to high to turn on the select transistor 922 of cell (0, 0) 918, while the rest of the word lines (e.g. $WL_{l-1}$ 924, where l is the total number of rows of the unit block 0 901) are turned off. Current pulse $I_1$ flows from the top circuitry, from a first terminal 926 of the MTJ cell (0, 0) 918 to a second terminal 928 of the MTJ cell (0, 0) 918, through the select transistor 922, and then terminates at the ground terminal (e.g. second reference potential terminal 910b). After the completion of this writing phase, WE will be de-activated. The duration of the injected pulse may be determined by the duration of the "on" state of the WE signal.

Figure 9B:
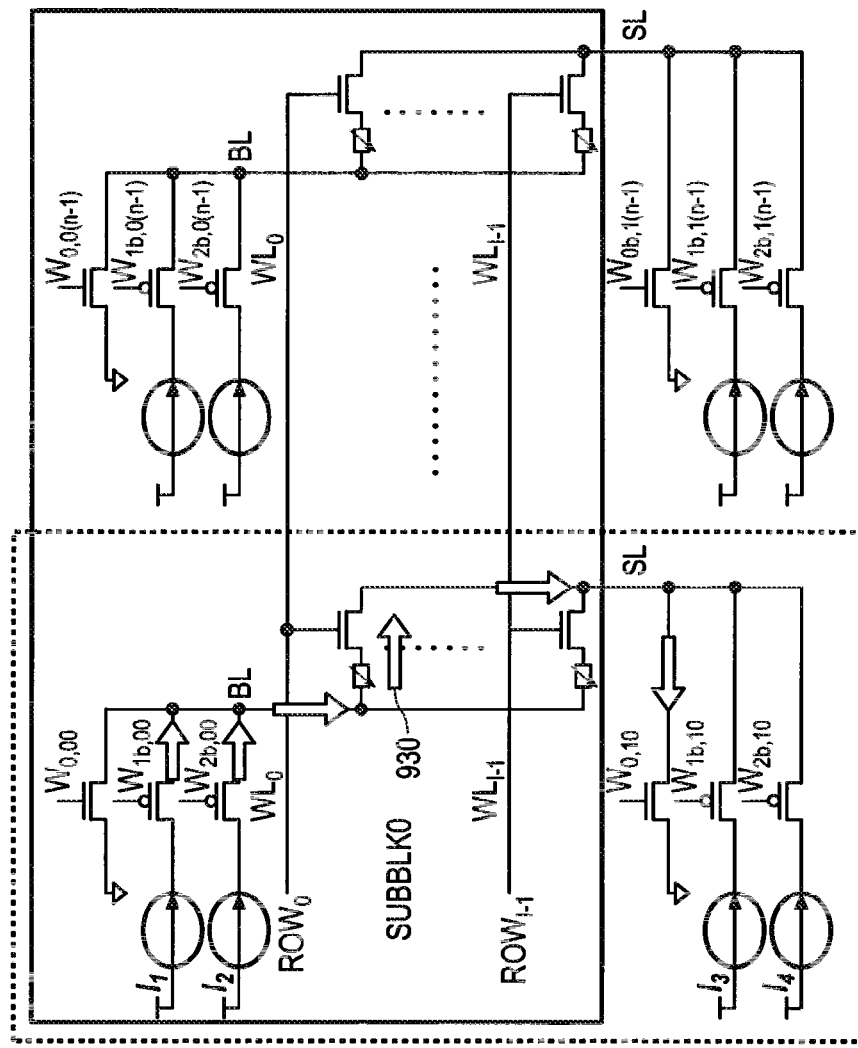
FIG. 9b shows a direction of a flow of a current pulse provided to a memory cell according to one embodiment.

The current pulse $I_1$ flows in a direction 930 which corresponds to a direction from the first terminal 926 of the cell (0, 0) 918 to the second terminal 928 of the cell (0, 0) 918. The current pulse $I_2$ may also flow in the direction 930. The direction 930 of the flow of current pulse $I_1$ or the current pulse $I_2$ are shown in FIG. 9b.

In one embodiment, the current pulse $I_3$ or the current pulse $I_4$ may flow from the bottom circuitry, through the select transistor 922, from the second terminal 928 of the MTJ cell (0, 0) 918 to the first terminal 926 of the cell (0, 0) 918, and then terminates at the ground terminal (e.g. first reference potential terminal 910a). The current pulse $I_3$ or the current pulse $I_4$ may flow in a direction 932 which corresponds to a direction from the second terminal 928 of the cell (0, 0) 918 to the first terminal 926 of the cell (0, 0) 918. The direction 932 of the flow of current pulse $I_3$ or the current pulse $I_4$ are shown in FIG. 7c.

The arrangement of the MTJ cells with the routing wire allows for the same potential drop across each cell. This ensures that each cell can experience the same writing speed and environment.

Figure 10:
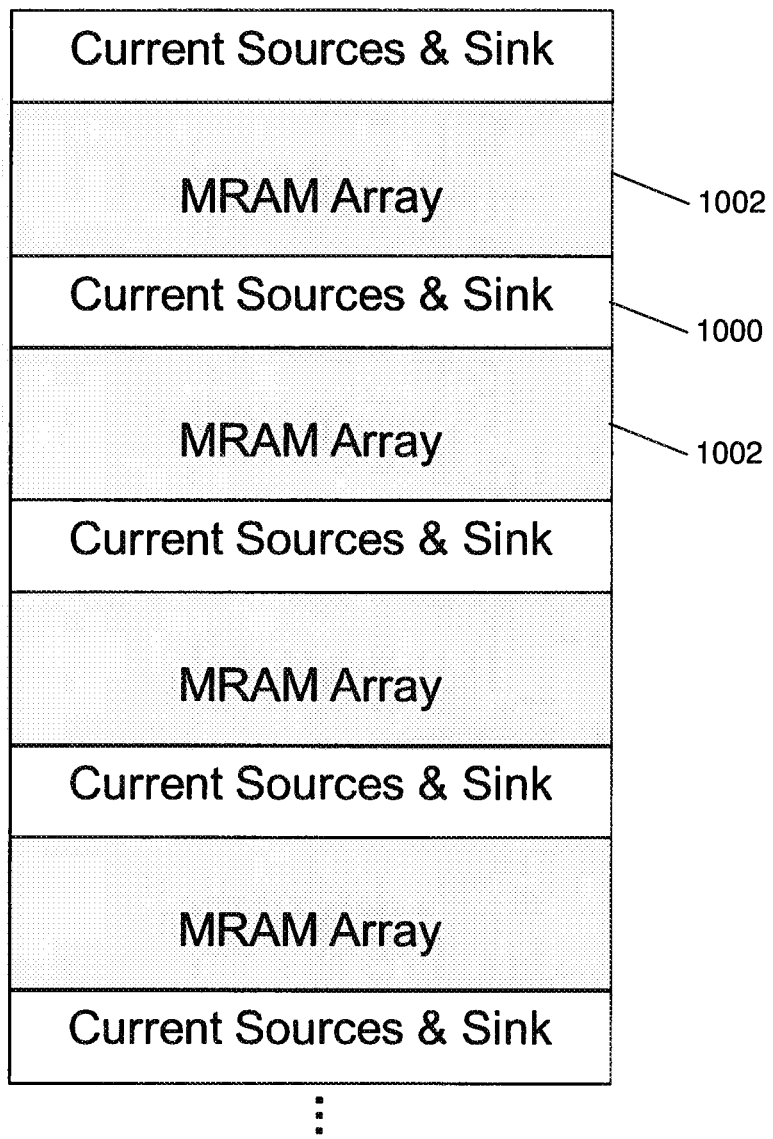
FIG. 10 shows a block diagram of an arrangement of a writing circuit and memory cell arrays according to one embodiment.

To make the writing circuit 900 extensive with the memory sub-blocks, the bidirectional writing circuit 900 may be arranged as shown in FIG. 10. This arrangement can help to reduce the silicon area used as the current sources 1000 are shared by adjacent memory sub-blocks 1002.

The pseudo-code for the logic control of bi-directional writing circuitry for 2BPC STT-MRAM at one side is listed below:

Write data to sub-block 2i, column j:
$W_{0,(2i)j}$=!$D_1$&WE&$COL_j$&$BLK_{2i}$
$W_{1b,(2i)j}$=!($D_1$&!$D_0$&WE&$COL_j$&$BLK_{2i}$)
$W_{2b,(2i)j}$=!($D_1$&$D_0$&WE&$COL_j$&$BLK_{2i}$)
$W_{0,(2i+1)j}$=$D_1$&WE&$COL_j$&$BLK_{2i+i}$ $W_{1b,(2i+1)j}$=!(!$D_1$&!$D_0$&WE&$COL_j$$BLK_{2i+1}$)
$W_{2b,(2i+1)j}$=!(!$D_1$&$D_0$&WE&$CO_j$$BLK_{2i+1}$)
Write data to sub-block 2i+1, column j:
$W_{0,(2i+1)j}$=!D&WE&$COL_j$&$BLK_{2i+1}$
$W_{1b,(2i+1)j}$=!($D_1$&!$D_0$&WE&$COL_j$&$BLK_{2i+1}$)
$W_{2b,(2i+1)j}$=!($D_1$&$D_0$&WE&$COL_j$&$BLK_{2i+1}$)
$W_{0,(2i+2)j}$=$D_1$&WE&$COL_j$&$BLK_{2i+2}$
$W_{1b,(2i+2)j}$=!(!$D_1$&!$D_0$&WE&$COL_j$&$BLK_{2i+2}$)
$W_{2b,(2i+2)j}$=!(!$D_1$&$D_0$&WE&$COL_j$&$BLK_{2i+2}$)

where $0 \leq 2i \leq m-2$
$0 \leq j \leq n-1$

TABLE 2

List of annotations for the signals used in the pseudo-code.

| Signal | Description |
| --- | --- |
| $W_{0,ij}/W_{nb,ij}$ | Bidirectional Writing Control Signal |
| WE | Write Enable Signal |
| $COL_j$ | Column Selecting Address |
| $BLK_i$ | Block Selecting Signal |
| $D_1$, $D_0$ | Data Bit to be written to the cell |
| $ROW_l$ | ROW Selecting Signal |

Figure 9C:
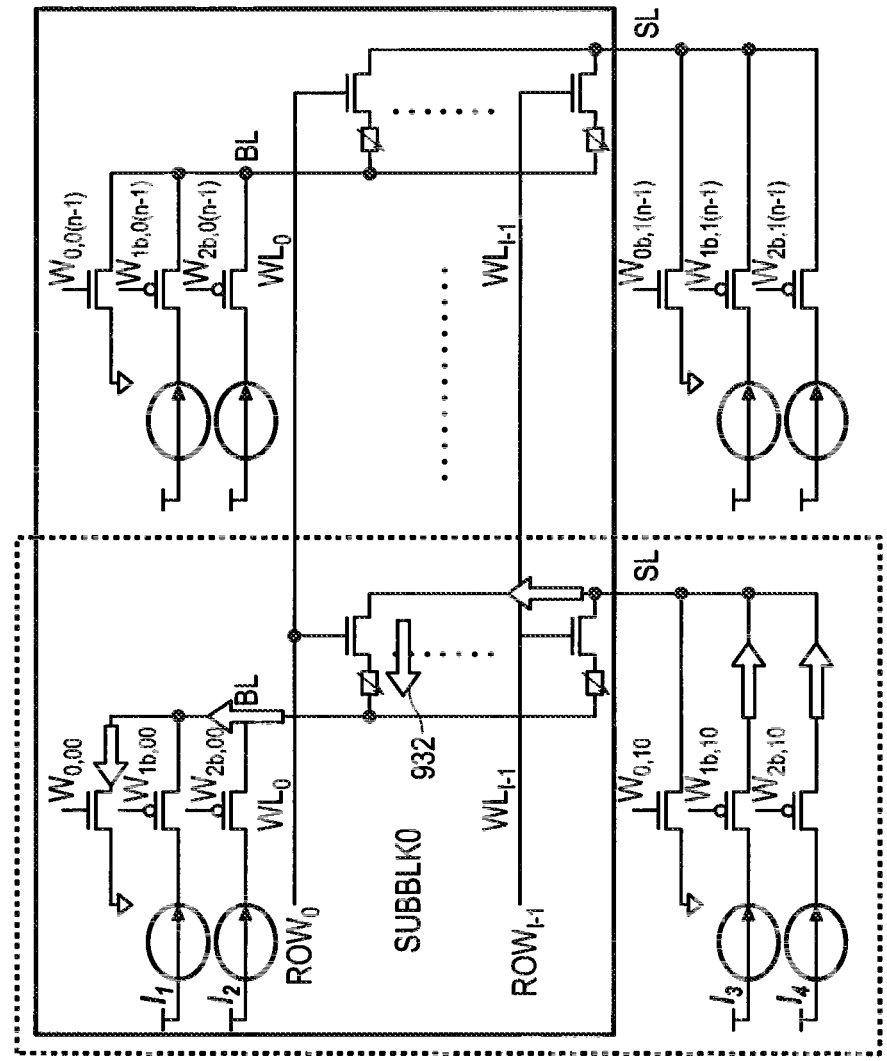
FIG. 9c shows a direction of a flow of a current pulse provided to a memory cell according to one embodiment.

Based on the pseudo-code for the writing scheme for the writing circuit 900 of FIG. 9, to write data to sub-block 2i, column j ($0 \leq 2i \leq m-2$, $0 \leq j \leq n-1$, where m is the total number of sub-blocks of the memory cell arrangement, and n is the total number of columns of the memory cell arrangement), the Bidirectional Writing Control Signal $W_{0,(2i)j}$ is determined by a combination of an inverse of $D_1$ and WE and $COL_j$ and $BLK_{2i}$. That is, $W_{0,(2i)j}$ is enabled (i.e. having a logic "1") only when the data bit $D_1$ to be written into the cell is logic "0", and the Write Enable signal (WE), the Column Selecting Address ($COL_j$) and the Block Selecting Signal ($BLK_{2i}$) are enabled (i.e. having a logic "1"). For all other combinations, $W_{0,(2i)j}$ is disabled (i.e. having a logic "0").

The Bidirectional Writing Control Signal $W_{1b,(2i)j}$ is determined by the inverse of a combination of $D_1$ and an inverse of $D_0$ and WE and $COL_j$ and $BLK_{2i}$. That is, $W_{1b,(2i)j}$ is enabled (i.e. having a logic "1") only when the data bit $D_1$ to be written into the cell is logic "0" or the data bit $D_0$ to be written into the cell is logic "1" and at least one of the Write Enable signal (WE), the Column Selecting Address ($COL_j$) and the Block Selecting Signal ($BLK_{2i}$) is disabled (i.e. having a logic "0"). For all other combinations, $W_{1b,(2i)j}$ is disabled (i.e. having a logic "0").

The Bidirectional Writing Control Signal $W_{2b,(2i)j}$ is determined by the inverse of a combination of $D_1$ and $D_0$ and WE and $COL_j$ and $BLK_{2i}$. That is, $W_{2b,(2i)j}$ is enabled (i.e. having a logic "1") only when the data bit $D_1$ to be written into the cell is logic "0" or the data bit $D_0$ to be written into the cell is logic "0" and at least one of the Write Enable signal (WE), the Column Selecting Address ($COL_j$) and the Block Selecting Signal ($BLK_{2i}$) is disabled (i.e. having a logic "0"). For all other combinations, $W_{2b,(2i)j}$ is disabled (i.e. having a logic "0").

The Bidirectional Writing Control Signal $W_{0,(2i+1)j}$ is determined by a combination of $D_1$ and WE and $COL_j$ and $BLK_{2i+1}$. That is, $W_{0,(2i+1)j}$ is enabled (i.e. having a logic "1") only when the data bit $D_1$ to be written into the cell is logic "1", and the Write Enable signal (WE), the Column Selecting Address ($COL_j$) and the Block Selecting Signal ($BLK_{2i+1}$) are enabled (i.e. having a logic "1"). For all other combinations, $W_{0,(2i+1)j}$ is disabled (i.e. having a logic "0").

The Bidirectional Writing Control Signal $W_{1b,(2i+1)j}$ is determined by the inverse of a combination of an inverse of $D_1$ and an inverse of $D_0$ and WE and $COL_j$ and $BLK_{2i+1}$. That is $W_{1b,(2i+1)j}$ is enabled (i.e. having a logic "1") only when the data bit $D_1$ to be written into the cell is logic "1" or the data bit $D_0$ to be written into the cell is logic "1" and at least one of the Write Enable signal (WE), the Column Selecting Address ($COL_j$) and the Block Selecting Signal ($BLK_{2i+1}$) is disabled (i.e. having a logic "0"). For all other combinations, $W_{1b,(2i+1)j}$ is disabled (i.e. having a logic "0").

The Bidirectional Writing Control Signal $W_{2b,(2i+1)j}$ is determined by the inverse of a combination of an inverse of $D_1$ and $D_0$ and WE and $COL_j$ and $BLK_{2i+1}$. That is, $W_{2b,(2i+1)j}$ is enabled (i.e. having a logic "1") only when the data bit $D_1$ to be written into the cell is logic "1" or the data bit $D_0$ to be written into the cell is logic "0" and at least one of the Write Enable signal (WE), the Column Selecting Address ($COL_j$) and the Block Selecting Signal ($BLK_{2i+1}$) is disabled (i.e. having a logic "0"). For all other combinations, $W_{2b,(2i+1)j}$ is disabled (i.e. having a logic "0").

To write data to sub-block 2i+1, column j, the bidirectional Writing Control Signal $W_{0,(2i+1)j}$ is determined by a combination of an inverse of $D_1$ and WE and $COL_j$ and $BLK_{2i+1}$. That is, $W_{0,(2i+1)j}$ is enabled (i.e. having a logic "1") only when the data bit $D_1$ to be written into the cell is logic "0", and the Write Enable signal (WE), the Column Selecting Address ($COL_j$) and the Block Selecting Signal ($BLK_{2i+1}$) are enabled (i.e. having a logic "1"). For all other combinations, $W_{0,(2i+1)j}$ is disabled (i.e. having a logic "0").

The Bidirectional Writing Control Signal $W_{1b,(2i+1)j}$ is determined by the inverse of a combination of $D_1$ and an inverse of $D_0$ and WE and $COL_j$ and $BLK_{2i+1}$. That is, $W_{1b,(2i+1)j}$ is enabled (i.e. having a logic "1") only when the data bit $D_1$ to be written into the cell is logic "0" or the data bit $D_0$ to be written into the cell is logic "1" and at least one of the Write Enable signal (WE), the Column Selecting Address ($COL_j$) and the Block Selecting Signal ($BLK_{2i+1}$) is disabled (i.e. having a logic "0"). For all other combinations, $W_{1b,(2i+1)j}$ disabled (i.e. having a logic "0").

The Bidirectional Writing Control Signal $W_{2b,(2i+1)j}$ is determined by the inverse of a combination of $D_1$ and $D_0$ and WE and $COL_j$ and $BLK_{2i+1}$. That is. $W_{2b,(2i+1)j}$ is enabled (i.e. having a logic "1") only when the data bit $D_1$ to be written into the cell is logic "0" or the data bit $D_0$ to be written into the cell is logic "0" and at least one of the Write Enable signal (WE), the Column Selecting Address ($COL_j$) and the Block Selecting Signal ($BLK_{2i+1}$) is disabled (i.e. having a logic "0"). For all other combinations, $W_{2b,(2i+1)j}$ is disabled (i.e. having a logic "0").

The Bidirectional Writing Control Signal $W_{0,(2i+2)j}$ is determined by a combination of $D_1$ and WE and $COL_j$ and $BLK_{2i+2}$. That is, $W_{0,(2i+2)j}$ is enabled (i.e. having a logic "1") only when the data bit $D_1$ to be written into the cell is logic "1", and the Write Enable signal (WE), the Column Selecting Address ($COL_j$) and the Block Selecting Signal ($BLK_{2i+2}$) are enabled (i.e. having a logic "1"). For all other combinations, $W_{0,(2i+2)j}$ is disabled (i.e. having a logic "0").

The Bidirectional Writing Control Signal $W_{1b,(2i+2)j}$ is determined by the inverse of a combination of an inverse of $D_1$ and an inverse of $D_0$ and WE and $COL_j$ and $BLK_{2i+2}$. That is, $W_{1b,(2i+2)j}$ is enabled (i.e. having a logic "1") only when the data bit $D_1$ to be written into the cell is logic "1" or the data bit $D_0$ to be written into the cell is logic "1" and at least one of the Write Enable signal (WE), the Column Selecting Address ($COL_j$) and the Block Selecting Signal ($BLK_{2i+2}$) is disabled (i.e. having a logic "0"). For all other combinations, $W_{1b,(2i+2)j}$ is disabled (i.e. having a logic "0").

The Bidirectional Writing Control Signal $W_{2b,(2i+2)j}$ is determined by the inverse of a combination of an inverse of $D_1$ and $D_0$ and WE and $COL_j$ and $BLK_{2i+2}$. That is $W_{2b,(2i+2)j}$ is enabled (i.e. having a logic "1") only when the data bit $D_1$ to be written into the cell is logic "1" or the data bit $D_0$ to be written into the cell is logic "0" and at least one of the Write Enable signal (WE), the Column Selecting Address ($COL_j$) and the Block Selecting Signal ($BLK_{2i+2}$) is disabled (i.e. having a logic "0"). For all other combinations, $W_{2b,(2i+2)j}$ is disabled (i.e. having a logic "0").

Various embodiments of the writing circuit use dedicated current sources supply for each cell in the array and use one write pulse for each logic state. Various embodiments of the writing circuit do not use negative current and/or voltage source. Various embodiments of the writing circuit provide similar writing environment for each cell. Various embodiments of the writing circuit allow reuse and share of write circuitry between blocks to save silicon area. Various embodiments of the writing circuit can be formed by CMOS design and processes.

When voltage pulse writing mode is used instead of current pulse writing mode, the transition of highest resistance state (Level 3) to lowest resistance state (Level 0) as shown in FIG. 2b may result in the overdriving of current. If the resistance difference is huge, the amount of current being overdriven is also proportional, based on V=IR characteristics. Without limiting the current supplied during the transition, there will be uncontrolled energy wastage, reduction in the lifetime of the MTJ, and the MTJ material properties may be degraded, or even damaged.

Figure 11:
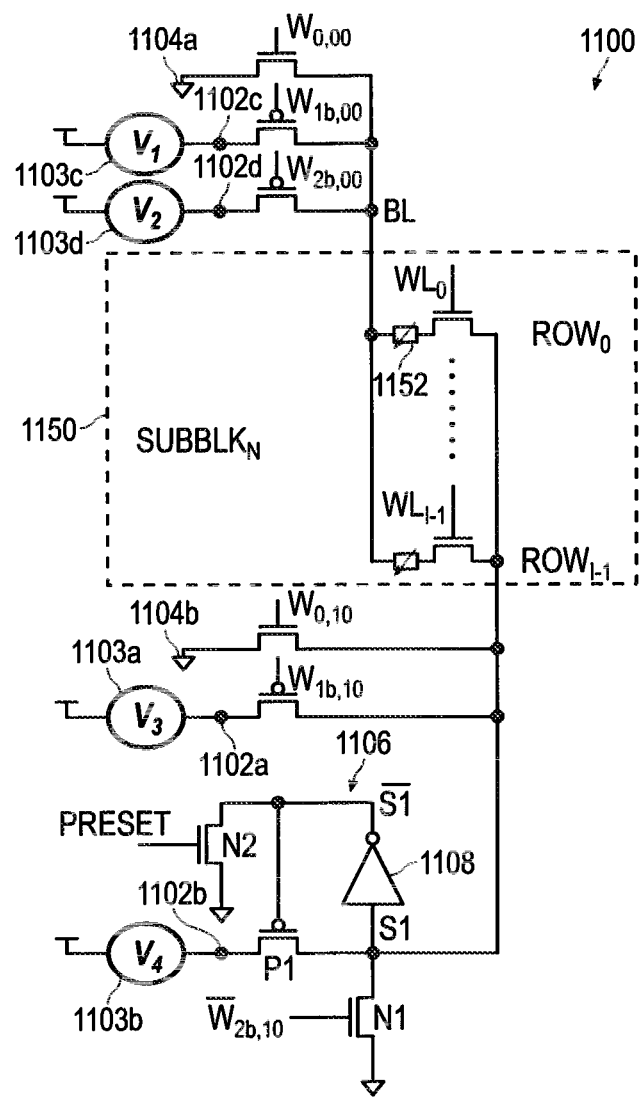
FIG. 11 shows a voltage mode writing circuit according to one embodiment.

To address the issue of undesired current overdrive dynamically, a current overdriving protection circuit is introduced for the voltage mode writing as shown in FIG. 11. FIG. 11 shows a voltage mode writing circuit 1100 for one column of a sub-block 1150 of memory array in bidirectional voltage pulse writing mode. The circuit 1100 has the same or a similar arrangement of the writing circuit 900 of FIG. 9. In other embodiments, the circuit 1100 may have the same or a similar arrangement of the writing circuit 700 of FIG. 7.

The circuit 1100 may include a first electrical connecting terminal 1102a, a second electrical connecting terminal 1102b, a third electrical connecting terminal 1102c and a fourth electrical connecting terminal 1102d.

In one embodiment, the four electrical connecting terminals 1102a-1102d may include voltage sources respectively. The first electrical connecting terminal 1102a may include a first voltage source 1103a which can provide a V3 voltage pulse. The second electrical connecting terminal 1102b may include a second voltage source 1103b which can provide a V4 voltage pulse. The third electrical connecting terminal 1102c may include a third voltage source 1103c which can provide a V1 voltage pulse. The fourth electrical connecting terminal 1102d may include a fourth voltage source 1103d which can provide a V2 voltage pulse.

In one embodiment, the first electrical connecting terminal 1102a, the second electrical connecting terminal 1102b, the third electrical connecting terminal 1102c and the fourth electrical connecting terminal 1102d may be coupled to the first voltage source 1103a, the second voltage source 1103b, the third voltage source 1103c and the fourth voltage source 1103d respectively.

The first voltage source 1103a, the second voltage source 1103b, the third voltage source 1103c and the fourth voltage source 1103d may be voltage sources external to the memory array and the writing circuit 1100.

The circuit 1100 may include a first reference potential terminal 1104a and a second reference potential terminal 1104b. Each of the first reference potential terminal 1106a and the second reference potential terminal 1104b may be ground.

For writing a level 0 (lowest resistance) state from a level 3 (highest resistance) state, a V4 voltage pulse may be used. The V4 voltage pulse may be applied to the selected MTJ cell 1152. A current overdriving protection circuit 1106 may be coupled to the second electrical connecting terminal 1102b. The current overdriving protection circuit 1106 may include an inverter 1108, a p-channel metal-oxide-semiconductor field-effect transistor (pMOS) P1, and an n-channel metal-oxide-semiconductor field-effect transistor (nMOS) N2. An nMOS N1 may be coupled to the second electrical connecting terminal 1102b.

If V4 pulse is not selected, the signal $W_{2b,10}$ will be low and the signal $\overline{W}_{2b,10}$ will be high to turn on the nMOS N1. Consequently, S1 node will be pulled to ground, and $\overline{S1}$ will be pulled to VDD because of the inverter 1108. As a result, the pMOS P1 is turned off. Similarly, the PRESET signal is set low, which turns off the nMOS N2.

To activate the V4 voltage pulse, $\overline{W}_{2b,10}$ will be set low to turn off nMOS N1. The PRESET signal will have a small pulse to activate nMOS N2, and to pull down the $\overline{S1}$ signal to ground. Sequentially, this turns on the pMOS P1. Voltage V4 will pass through node S1 and the selected MTJ cell 1152 will be written. As the voltage on the node S1 will equal to V4, the output of the inverter will be maintained at low value. The pMOS P1 will be turned on during activation of V4 pulse and before the resistance state of the MTJ cell changes.

As the MTJ cell 1152 changes its state and as its resistance becomes much smaller, the potential at the node S1 will be reduced. Once the potential at the node S1 becomes much smaller than the threshold of the inverter 1108, the output of the inverter 1108 will be pulled to VDD. This consequently will turn off the pMOS P1.

In various embodiments, the current overdriving protection circuit 1106 may be coupled to one or more of the plurality of electrical connecting terminals 1102a-1102d.

Figure 12:
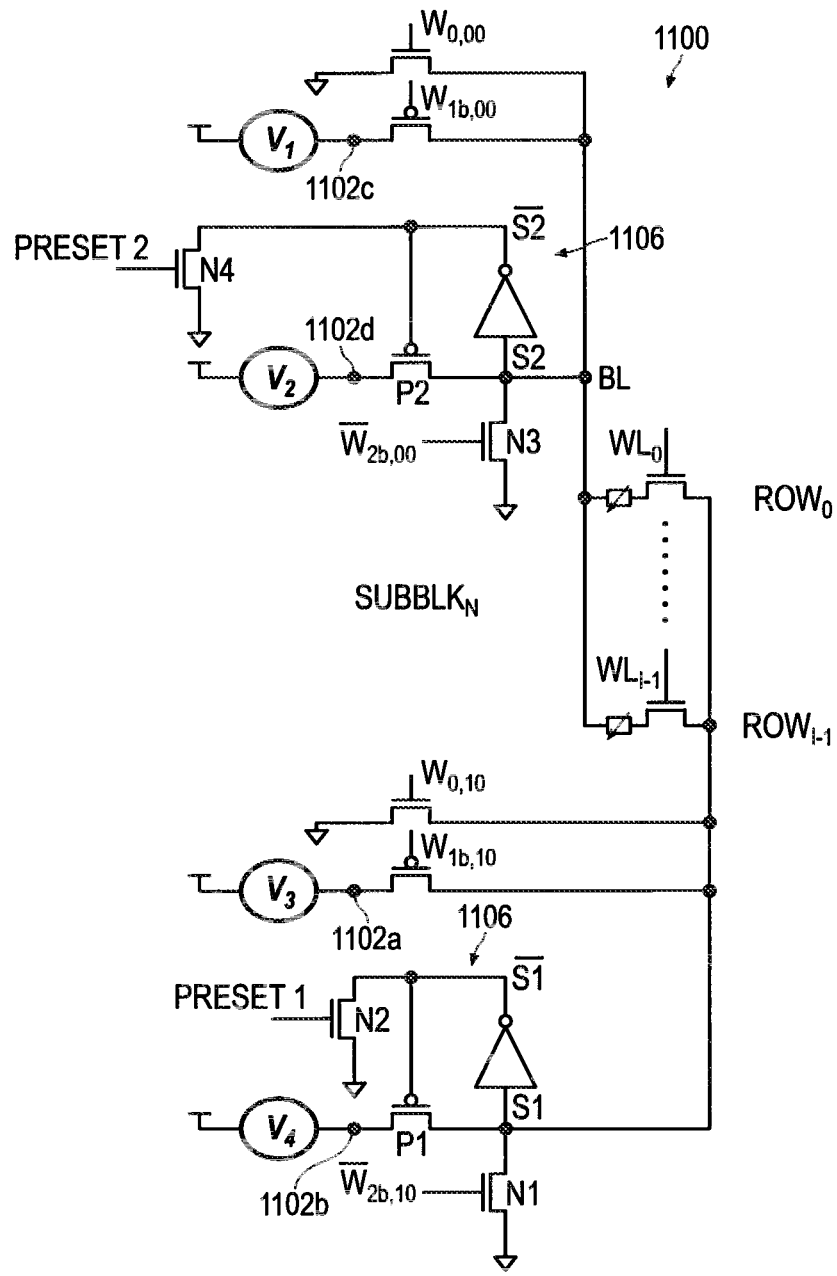
FIG. 12 shows a voltage mode writing circuit according to one embodiment.

FIG. 12 shows that a current overdriving protection circuit 1106 is coupled to each of the second electrical connecting terminal 1102b and the fourth electrical connecting terminal 1102d. For the potential configurations with each MTJ cell which may have different writing pulse duration and different change in the resistance level, dedicated current overdriving protection circuit may be introduced to each MTJ cells. In other words, a current overdriving protection circuit 1106 may be coupled to all the electrical connecting terminals 1102a-1102d.

For the general writing scheme, the arrangement of the MTJ cell with the corresponding select transistor and the sources can be routed in a fashion that the transistor is able to drive desired current under different polarities. As the nMOS transistor will suffer from "body effect" when it is under negative bias, its driving current will be deteriorated. This means the driving window of the nMOS transistor will be smaller when it is under negative bias as compared to the case when it is under positive bias. Design scheme, like the way the layers in the MBPC MTJ are grown, can be considered together with IC design implementation.

The magnetic configuration of e.g. 2BPC STT-MRAM can determine the resistance level, when a read current of a fixed value is sent to read out the voltage of the cell. For an array of memory cells, there will be a Gaussian distribution of the STT-MRAM array for each voltage level. Variations in materials stacks and crystal structures, fabrication processes, and annealing temperature are some of the factors determining the Gaussian distribution.

Figure 13:
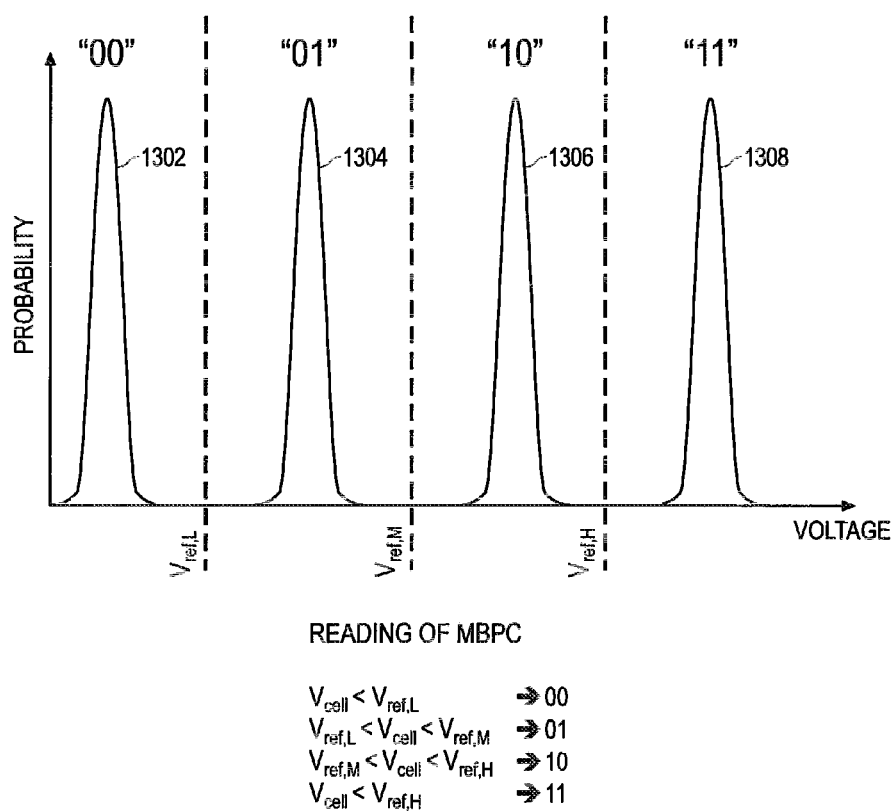
FIG. 13 shows voltage levels for different magnetic configurations of a memory cell according to one embodiment.

FIG. 13 shows a voltage level distribution of the STT-MRAM array, which shows four distribution curves 1302, 1304, 1306, 1308 for the four voltage levels of different magnetic state configurations/logic states. To differentiate one voltage level from the next one level, a reference voltage needs to be defined above the upper tail of a lower voltage level and below the lower tail of the next voltage level. For the four voltage levels of 2BPC STT-MRAM, there needs to be three reference voltages, $V_{ref,L}$, $V_{ref,M}$, $V_{ref,H}$, respectively, whereby $V_{ref,L} < V_{ref,M} < V_{ref,H}$. This forms the basis for the discretization of the read-out signal from the cell, into two binary bits.

The discretization of the read-out signal from 2BPC are as follows:

| | |
|---|---|
| $V_{cell} \leq V_{ref,L}$ | → 00 |
| $V_{ref,L} < V_{cell} \leq V_{ref,M}$ | → 01 |
| $V_{ref,M} < V_{cell} \leq V_{ref,H}$ | → 10 |
| $V_{cell} > V_{ref,H}$ | → 11 |

If the voltage of the cell ($V_{cell}$) is smaller than or equal to the reference voltage $V_{ref,L}$, the read-out signal is discretized as "00". If the voltage of the cell ($V_{cell}$) is larger than the reference voltage $V_{ref,L}$ and is smaller than or equal to the reference voltage $V_{ref,M}$, the read-out signal is discretized as "01". If the voltage of the cell ($V_{cell}$) is larger than the reference voltage $V_{ref,M}$ and is smaller than or equal to the reference voltage $V_{ref,H}$, the read-out signal is discretized as "10". If the voltage of the cell ($V_{cell}$) is larger than the reference voltage $V_{ref,H}$, the read-out signal is discretized as "11".

Figure 14:
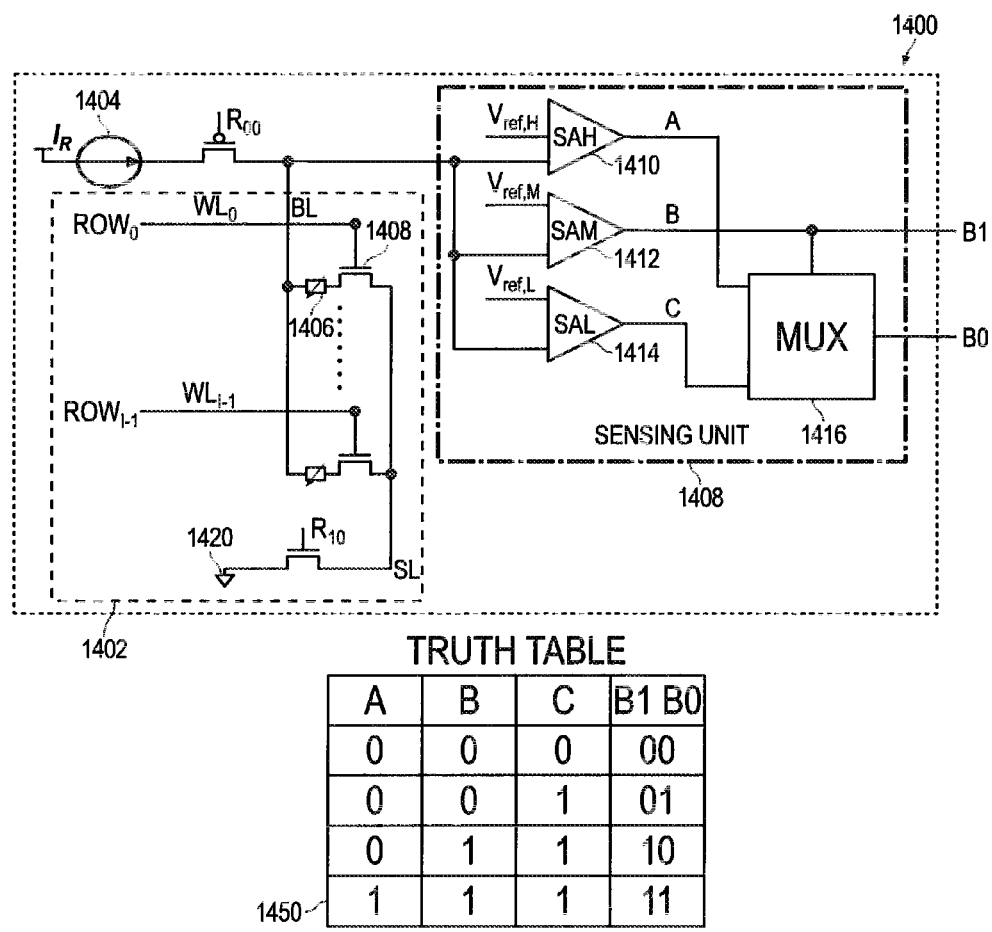
FIG. 14 shows a schematic circuit diagram of a sensing circuit according to one embodiment.

FIG. 14 shows a schematic circuit diagram of a sensing circuit 1400 for a unit block 1402 for e.g. 2BPC STT-MRAM, addressing a column of memory cells. The circuit 1400 may include a current source 1404 to output a read current $I_R$ into a selected memory cell 1406 for sensing. The circuit 1400 may include a sensing unit 1408 which includes a sense amplifier SAH 1410 for high voltage level referencing, a sense amplifier SAM 1412 for medium voltage level referencing, and a sense amplifier SAL 1414 for low voltage level referencing. The sensing unit 1408 may include a multiplexer 1416 for discretization of the read-out signal into two binary data bits, B1 and B0.

The reading process for the cell (0, 0) 1406 of the unit-block 1402 will be described in the following. Upon receiving of the read enable (RE) command, the switches $R_{00}$ and $R_{10}$ will be turned on. The $WL_0$ signal will be high to turn on the corresponding select transistor 1418 for the cell (0, 0) 1406. The current $I_R$ will flow from the top into the cell (0, 0) 1406 and the ground terminal 1420. The potential ($V_{Read}$) of the cell (0, 0) 1406 will then be fed to the sensing unit 1408 to be compared with the reference voltages ($V_{ref,L}$, $V_{ref,M}$, and $V_{ref,H}$) in the sense amplifier SAL 1414, the sense amplifier SAM 1412 and the sense amplifier SAH 1410 respectively.

If $V_{Read}$ is less than $V_{ref,H}$, the sense amplifier SAH 1410 will output A as "0". If $V_{Read}$ is more than $V_{ref,M}$ and $V_{ref,L}$, both the sense amplifier SAM 1412 and the sense amplifier SAL 1414 will output B and C as "1" and "1", respectively. The three outputs (A, B, and C) will then passed into the multiplexer 1416 to turn the information into a two binary bits (B1 and B0) output "10" as shown in the truth table 1450 of FIG. 14.

The RE command is turn-off once the two binary bits information is read. Depending on the $V_{Read}$, the sensing unit will discretize the information into two binary data bits, for the case of 2BPC STT-MRAM. For n-bits per cell, the number of the sense amplifiers required may be about ($2^n-1$). The arrangement of the MTJ cells with the routing are symmetrically designed for the same potential drop across each cell. This can ensure that each cell experience the same reading speed and environment. The duration of the injected pulse may be determined by the duration of the "on" state of RE signal. After the cell has been read, the various switches will be switched off.

Figure 15:
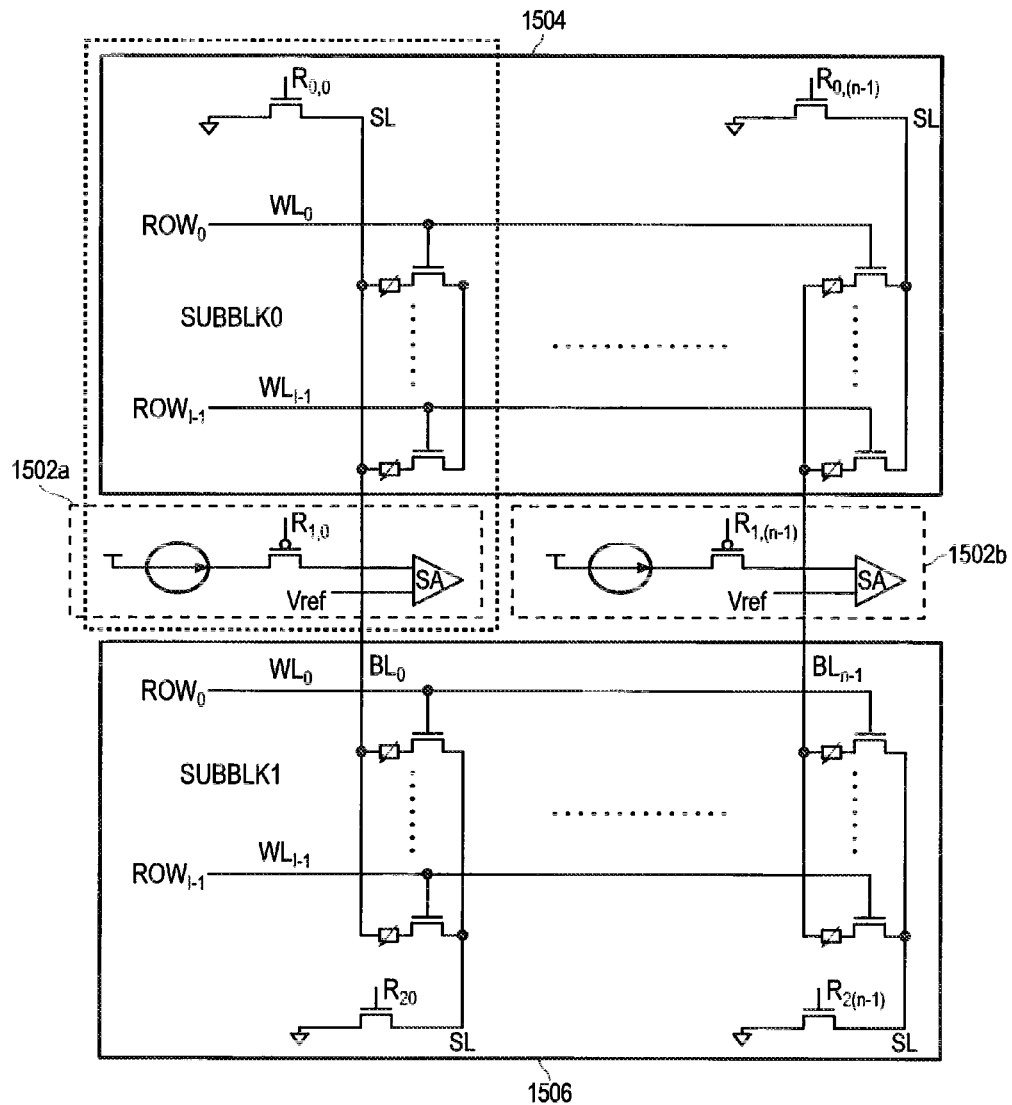
FIG. 15 shows a schematic circuit diagram of a sensing circuit according to one embodiment.

FIG. 15 shows a schematic circuit diagram illustrating sensing circuits 1502a, 1502b shared between two sub-blocks 1504, 1506. In one embodiment, the reading current circuitry and the sensing units can also be arranged to be shared between two or more sub-blocks. This can reduce the silicon area used. In addition, the bias and addresses can be reused in the design.

Although voltage mode sensing scheme has been illustrated, it will be understood by a skilled person that the same design can be implemented for a current-mode sensing scheme. In addition, a modification of the sensing circuit can be made for the current mode sensing circuit. Instead of supplying a read current, a read voltage will be applied to the selected cell for the sensing of the current amplitude which has passed through the cell.

Figure 16:
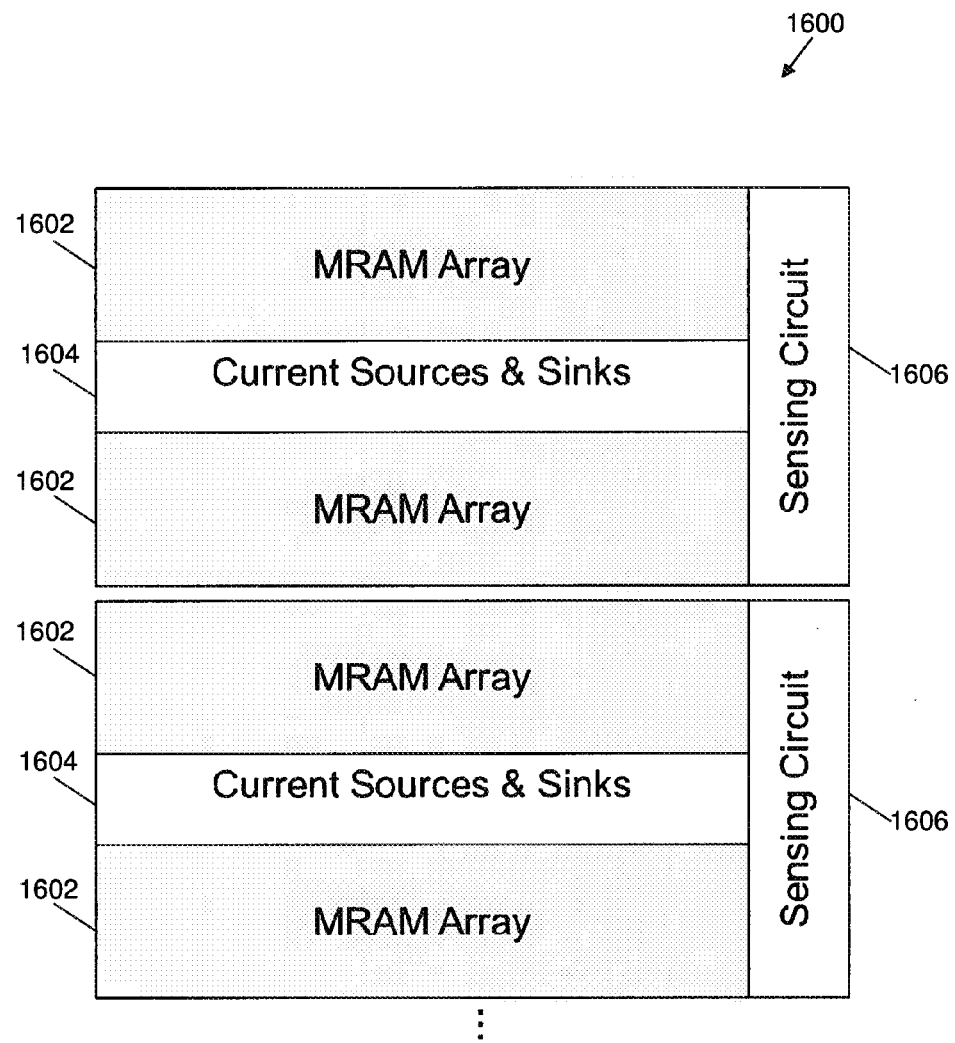
FIG. 16 shows a block diagram of an arrangement of memory cell arrays, a writing circuit and a sensing circuit according to one embodiment.

FIG. 16 shows a block diagram of an arrangement 1600 of memory sub-blocks 1602, a bidirectional writing circuit 1604 with current sources at one side, and a sensing circuit 1606 according to one embodiment.

Figure 17:
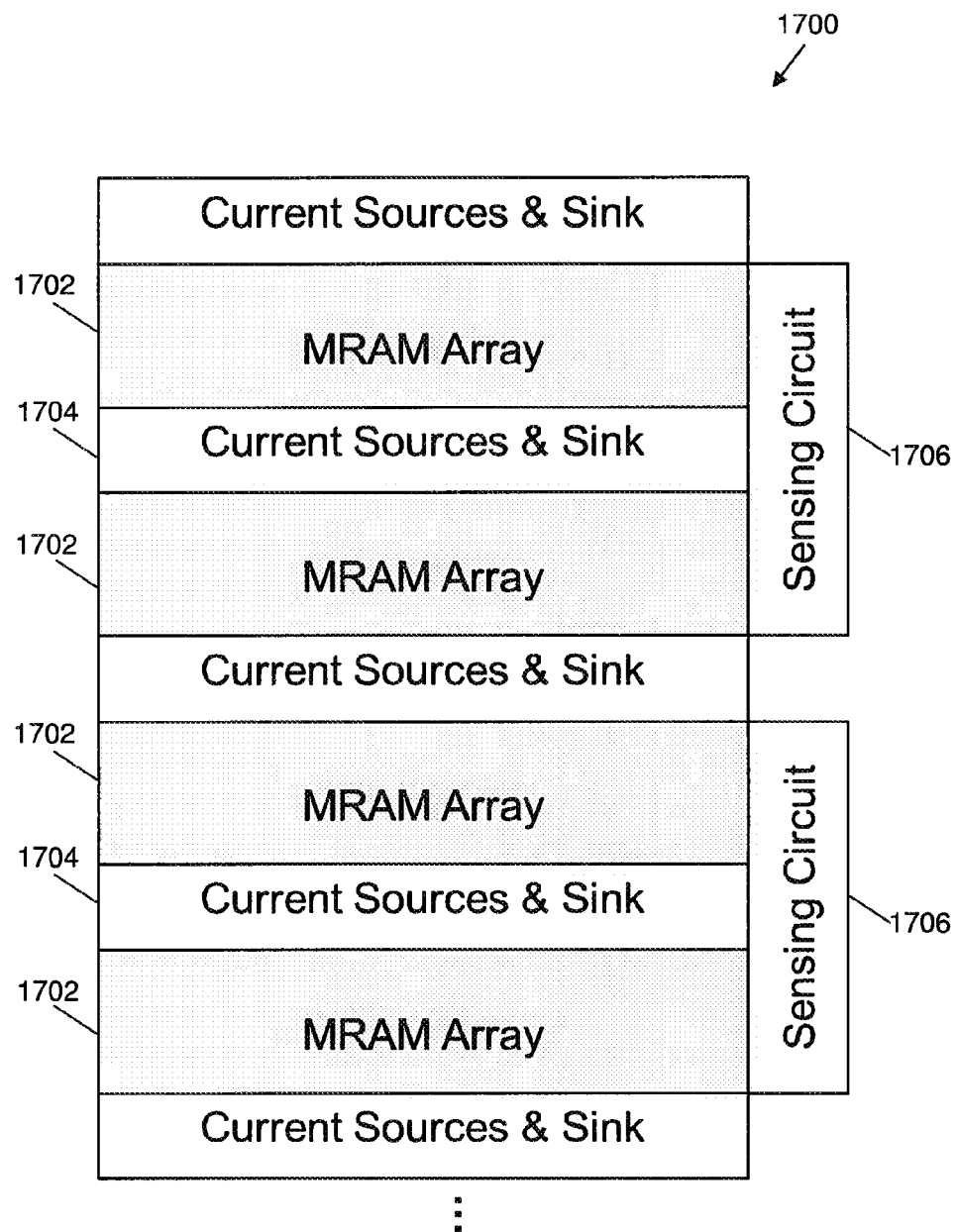
FIG. 17 shows a block diagram of an arrangement of memory cell arrays, a writing circuit and a sensing circuit according to one embodiment.

FIG. 17 shows a block diagram of an arrangement 1700 of memory sub-blocks 1702, a bidirectional writing circuit 1704 with current sources at two sides, and a sensing circuit 1706 according to one embodiment.

Both arrangements of FIG. 16 and FIG. 17 can save silicon area as the sensing circuits are shared by adjacent memory sub-blocks. Similarly, the memory sub-blocks can be arranged in similar fashion like FIG. 1.

For the sensing circuit 1400, the pseudo-code for the logic control is as follows:

---

Read data to sub-block 2i, column j:
$R_{2i,j}$=RE&$COL_j$&$BLK_{2i}$
$R_{(2i+1),j}$=!(RE&$COL_j$&$BLK_{(2i+1)}$)

--- where $0 \leq 2i \leq m-1$
$0 \leq j \leq n-1$

TABLE 3

List of annotations for the signals used in the pseudo-code.

| Signal | Description |
| --- | --- |
| $R_{2i,j}$/$R_{(2i+1),j}$ | Bidirectional Reading Control Signal |
| RE | Read Enable Signal |
| $COL_j$ | Column Selecting Address |
| $BLK_{2i}$/$BLK_{2i+1}$ | Block Selecting Signal |
| $ROW_l$ | ROW Selecting Signal |

Based on the pseudo-code for the reading scheme for the reading circuit 1400 of FIG. 14, to read data to sub-block 2i, column j ($0 \leq 2i \leq m-2$, $0 \leq j \leq n-1$, where m is the total number of sub-blocks of the memory cell arrangement, and n is the total number of columns of the memory cell arrangement), the Bidirectional Reading Control Signal $R_{2i,j}$ is determined by a combination of RE and $COL_j$ and $BLK_{2i}$. That is, $R_{2i,j}$ is enabled (i.e. having a logic "1") only when the Read Enable signal (RE), the Column Selecting Address ($COL_j$) and the Block Selecting Signal ($BLK_{2i}$) are enabled (i.e. having a logic "1"). For all other combinations, $R_{2i,j}$ is disabled (i.e. having a logic "0").

The Bidirectional Reading Control Signal $R_{(2i+1),j}$ is determined by the inverse of a combination of RE and $COL_j$ and $BLK_{(2i+1)}$. That is, is enabled (i.e. having a logic "1") only when at least one of the Read Enable signal (RE), the Column Selecting Address ($COL_j$) and the Block Selecting Signal ($BLK_{(2i+1)}$) are disabled (i.e. having a logic "0"). For all other combinations, $R_{(2i+1),j}$ is disabled (i.e. having a logic "0").

Various embodiments may include bidirectional write and sense circuitries, based on complementary metal-oxide semiconductor (CMOS) processes, to interface with the MBPC STT-MRAM array. For the write circuitry, a write pulse with both controlled amplitude and direction may be used to determine the logic states of the magnetic tunnel junction (MTJ) cells with multi-bits. By having localized bi-directional write circuitry to the modular memory blocks, the write speed of the magnetoresistive memory can be improved with shorter writing path and reduction on electrical potential drop along the routing. For the sense circuitry, a read current may be passed into the selected cell for reading. The information read from the cell may then be compared using simplified sense amplifiers with reference voltages/currents and multiplexes for decoding the different voltage levels into binary data bits.

Various embodiments of the writing circuit use dedicated current sources supply for each cell in the array and use one write pulse for each logic state. Various embodiments of the writing circuit do not use negative current and/or voltage source. Various embodiments of the writing circuit provide similar writing environment for each cell. Various embodiments of the writing circuit allow reuse and share of write circuitry between blocks to save silicon area. Various embodiments of the writing circuit can be formed by CMOS design and processes.

Various embodiments of the sensing circuit use sense amplifiers and multiplexers for the distinct of multi-bits information and dedicated current sources supply for each cell in the array. Various embodiments of the sensing circuit do not use negative current and/or voltage source. Various embodiments of the sensing circuit provide similar reading environment for each cell. Various embodiments of the sensing circuit allow reuse and share of sense circuitry between blocks to save silicon area. Various embodiments of the sensing circuit can be formed by CMOS design and processes.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A writing circuit for a magnetoresistive memory cell, the writing circuit comprising:
   a first electrical connecting terminal configured to provide a first electrical signal in a first direction to the magnetoresistive memory cell;
   a second electrical connecting terminal configured to provide a second electrical signal in the first direction to the magnetoresistive memory cell;
   a third electrical connecting terminal configured to provide a third electrical signal in a second direction to the magnetoresistive memory cell;
   a fourth electrical connecting terminal configured to provide a fourth electrical signal in the second direction to the magnetoresistive memory cell;
   a first reference potential terminal;

a second reference potential terminal;
a first switch configured to couple one of the first electrical connecting terminal, the second electrical connecting terminal, the third electrical connecting terminal and the fourth electrical connecting terminal to the magnetoresistive memory cell;
a second switch configured to couple the first reference potential terminal to the magnetoresistive memory cell if the first electrical connecting terminal or the second electrical connecting terminal is coupled to the magnetoresistive memory cell, and to couple the second reference potential terminal to the magnetoresistive memory cell if the third electrical connecting terminal or the fourth electrical connecting terminal is coupled to the magnetoresistive memory cell;
wherein the first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell;
wherein the first electrical signal, the second electrical signal, the third electrical signal and the fourth electrical signal have different amplitudes;
wherein the first electrical signal, the second electrical signal, the third electrical signal and the fourth electrical signal have the same polarity.

2. The writing circuit of claim 1,
wherein the first electrical connecting terminal, the second electrical connecting terminal, the third electrical connecting terminal and the fourth electrical connecting terminal are arranged in parallel and at the same side of the magnetoresistive memory cell.

3. The writing circuit of claim 2,
wherein the first reference potential terminal and the second reference potential terminal are arranged in parallel and at the other side of the magnetoresistive memory cell facing away from the first electrical connecting terminal, the second electrical connecting terminal, the third electrical connecting terminal and the fourth electrical connecting terminal.

4. The writing circuit of claim 2,
wherein the second reference potential terminal comprises ground.

5. The writing circuit of claim 2,
wherein the first switch comprises a first transistor, a second transistor, a third transistor and a fourth transistor respectively comprising a source terminal, a drain terminal and a gate terminal;
wherein the drain terminal of the first transistor, the drain terminal of the second transistor, the drain terminal of the third transistor and the drain terminal of the fourth transistor are coupled to a bit line;
wherein the source terminal of the first transistor is coupled to the first electrical connecting terminal, the source terminal of the second transistor is coupled to the second electrical connecting terminal, the source terminal of the third transistor is coupled to the third electrical connecting terminal, and the source terminal of the fourth transistor is coupled to the fourth electrical connecting terminal.

6. The writing circuit of claim 2,
wherein the second switch comprises a fifth transistor and a sixth transistor respectively comprising a source terminal, a drain terminal and a gate terminal;
wherein the drain terminal of the fifth transistor and the drain terminal of the sixth transistor are coupled to a source line;
wherein the source terminal of the fifth transistor is coupled to the first reference potential terminal and the source terminal of the sixth transistor is coupled to the second reference potential terminal.

7. The writing circuit of claim 1,
wherein the first electrical connecting terminal, the second electrical connecting terminal and the second reference potential terminal are arranged in parallel and at the same side of the magnetoresistive memory cell.

8. The writing circuit of claim 7,
wherein the third electrical connecting terminal, the fourth electrical connecting terminal and the first reference potential terminal are arranged in parallel and at the other side of the magnetoresistive memory cell facing away from the first electrical connecting terminal, the second electrical connecting terminal and the second reference potential terminal.

9. The writing circuit of claim 7,
wherein each of the first reference potential terminal and the second reference potential terminal comprises ground.

10. The writing circuit of claim 7,
wherein the first switch comprises a first transistor, a second transistor, a third transistor and a fourth transistor respectively comprising a source terminal, a drain terminal and a gate terminal;
wherein the drain terminal of the first transistor and the drain terminal of the second transistor are coupled to a source line;
wherein the drain terminal of the third transistor and the drain terminal of the fourth transistor are coupled to a bit line;
wherein the source terminal of the first transistor is coupled to the first electrical connecting terminal, the source terminal of the second transistor is coupled to the second electrical connecting terminal, the source terminal of the third transistor is coupled to the third electrical connecting terminal, and the source terminal of the fourth transistor is coupled to the fourth electrical connecting terminal.

11. The writing circuit of claim 10,
wherein the second switch comprises a fifth transistor and a sixth transistor respectively comprising a source terminal, a drain terminal and a gate terminal;
wherein the drain terminal of the fifth transistor is coupled to the bit line and the drain terminal of the sixth transistor is coupled to the source line;
wherein the source terminal of the fifth transistor is coupled to the first reference potential terminal and the source terminal of the sixth transistor is coupled to the second reference potential terminal.

12. The writing circuit of claim 1,
wherein the plurality of electrical connecting terminals comprise at least one of voltage sources or current sources.

13. The writing circuit of claim 1,
wherein the electrical signals comprise at least one of voltage signals or current signals.

14. The writing circuit of claim 1,
wherein the writing circuit comprises a plurality of electrical connecting terminals.

15. The writing circuit of claim 14,
wherein the number of electrical connecting terminals is dependent on the number of bits to be written into the magnetoresistive memory cell.

16. The writing circuit of claim 15,
wherein the number of electrical connecting terminals is $2^n$ or ($2^n$+1), where n is the number of bits to be written into the magnetoresistive memory cell.

17. The writing circuit of claim 1, further comprising:
a current overdriving protection circuit coupled to one or more of the plurality of electrical connecting terminals.

18. A memory cell arrangement comprising:
a plurality of magnetoresistive memory cells;
a writing circuit for the magnetoresistive memory cell, the writing circuit comprising:
  a first electrical connecting terminal configured to provide a first electrical signal in a first direction to the magnetoresistive memory cell;
  a second electrical connecting terminal configured to provide a second electrical signal in the first direction to the magnetoresistive memory cell;
  a third electrical connecting terminal configured to provide a third electrical signal in a second direction to the magnetoresistive memory cell;
  a fourth electrical connecting terminal configured to provide a fourth electrical signal in the second direction to the magnetoresistive memory cell;
  a first reference potential terminal;
  a second reference potential terminal;
  a first switch configured to couple one of the first electrical connecting terminal, the second electrical connecting terminal, the third electrical connecting terminal and the fourth electrical connecting terminal to the magnetoresistive memory cell;
  a second switch configured to couple the first reference potential terminal to the magnetoresistive memory cell if the first electrical connecting terminal or the second electrical connecting terminal is coupled to the magnetoresistive memory cell, and to couple the second reference potential terminal to the magnetoresistive memory cell if the third electrical connecting terminal or the fourth electrical connecting terminal is coupled to the magnetoresistive memory cell;
  wherein the first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell;
  wherein the first electrical signal, the second electrical signal, the third electrical signal and the fourth electrical signal have different amplitudes;
  wherein the first electrical signal, the second electrical signal, the third electrical signal and the fourth electrical signal have the same polarity.

19. The memory cell arrangement of claim 18,
wherein the magnetoresistive memory cell comprises a spin transfer torque magnetoresistive random access memory.

20. A method of writing into a magnetoresistive memory cell of a memory cell arrangement, the method comprising:
  coupling one of a first electrical connecting terminal, a second electrical connecting terminal, a third electrical connecting terminal and a fourth electrical connecting terminal to the magnetoresistive memory cell;
  coupling a first reference potential terminal to the magnetoresistive memory cell if the first electrical connecting terminal or the second electrical connecting terminal is coupled to the magnetoresistive memory cell, and coupling a second reference potential terminal to the magnetoresistive memory cell if the third electrical connecting terminal or the fourth electrical connecting terminal is coupled to the magnetoresistive memory cell;
  wherein the first electrical connecting terminal provides a first electrical signal in a first direction to the magnetoresistive memory cell, the second electrical connecting terminal provides a second electrical signal in the first direction to the magnetoresistive memory cell, the third electrical connecting terminal provides a third electrical signal in a second direction to the magnetoresistive memory cell, and the fourth electrical connecting terminal provides a fourth electrical signal in the second direction to the magnetoresistive memory cell;
  wherein the first direction corresponds to a direction from a first terminal of the magnetoresistive memory cell to a second terminal of the magnetoresistive memory cell and the second direction corresponds to a direction from the second terminal of the magnetoresistive memory cell to the first terminal of the magnetoresistive memory cell;
  wherein the first electrical signal, the second electrical signal, the third electrical signal and the fourth electrical signal have different amplitudes;
  wherein the first electrical signal, the second electrical signal, the third electrical signal and the fourth electrical signal have the same polarity.

* * * * *